United States Patent
Tseng et al.

(10) Patent No.: US 11,687,065 B2
(45) Date of Patent: Jun. 27, 2023

(54) METHOD AND SYSTEM FOR GENERATING AND UPDATING POSITION DISTRIBUTION GRAPH

(71) Applicant: INDUSTRIAL TECHNOLOGY RESEARCH INSTITUTE, Hsinchu (TW)

(72) Inventors: Shau-Yin Tseng, Hsinchu County (TW); Jian-Wei Chen, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 252 days.

(21) Appl. No.: 17/132,715

(22) Filed: Dec. 23, 2020

(65) Prior Publication Data
US 2022/0197263 A1     Jun. 23, 2022

(30) Foreign Application Priority Data
Dec. 18, 2020 (TW) .................. 109144899

(51) Int. Cl.
*G05B 19/418* (2006.01)
*G06T 7/00* (2017.01)
(Continued)

(52) U.S. Cl.
CPC ... *G05B 19/41885* (2013.01); *G03F 7/70433* (2013.01); *G05B 19/4183* (2013.01);
(Continued)

(58) Field of Classification Search
CPC .......... G05B 19/41885; G05B 19/4183; G05B 19/4188; G03F 7/70433; G06N 7/005; G06T 7/0004

See application file for complete search history.

(56) References Cited

U.S. PATENT DOCUMENTS 5,754,443 A  *  5/1998  Manabe ............. H01J 37/3026
                                                                716/55
7,796,801 B2     9/2010  Kitamura et al.
(Continued)

FOREIGN PATENT DOCUMENTS

CN       101204890 B       6/2008
CN       104903044 B       9/2015
(Continued)

OTHER PUBLICATIONS

Taiwan Office Action dated Jul. 14, 2021 as received in application No. 109144899.
(Continued)

*Primary Examiner* — Pinalben Patel
(74) *Attorney, Agent, or Firm* — Maschoff Brennan

(57) ABSTRACT

A method for generating and updating position distribution graph comprises: generating a position distribution graph according to a circuit bitmap and an exposure pattern, performing an exposure simulation according to the position distribution graph to generate an exposure result graph, comparing the circuit bitmap with the exposure result graph to generate a plurality of error distribution candidate graphs, selecting one of the error distribution candidate graphs to serve as an error distribution graph, and performing a zero-one integer programming to update the position distribution graph according to the circuit bitmap and the error distribution graph, wherein the updated position distribution graph is associated with the error distribution graph.

24 Claims, 15 Drawing Sheets

(51) Int. Cl.
  *G03F 7/20* (2006.01)
  *G03F 7/00* (2006.01)
  *G06N 7/01* (2023.01)
(52) U.S. Cl.
  CPC ........... *G05B 19/4188* (2013.01); *G06N 7/01* (2023.01); *G06T 7/0004* (2013.01)

(56) References Cited

U.S. PATENT DOCUMENTS

| | | | |
|---|---|---|---|
| 10,304,180 | B2 | 5/2019 | Shi et al. |
| 2002/0164065 | A1* | 11/2002 | Cai ................. G03F 7/705 430/5 |
| 2003/0189746 | A1 | 10/2003 | Vernackt |
| 2018/0101944 | A1* | 4/2018 | Sakai ............... G01N 29/265 |
| 2019/0197374 | A1* | 6/2019 | Tseng ............... H04N 1/32251 |

FOREIGN PATENT DOCUMENTS

| | | |
|---|---|---|
| CN | 110213895 A | 9/2019 |
| CN | 110572941 A | 12/2019 |
| CN | 110572945 A | 12/2019 |
| CN | 107851315 B | 3/2020 |
| JP | 2015531160 A | 10/2015 |
| KR | 20070020283 A | 2/2007 |
| KR | 101526078 A | 6/2015 |
| TW | 200539763 | 12/2005 |
| TW | I336778 B | 2/2011 |
| TW | I525221 | 3/2016 |
| TW | I618821 | 3/2018 |
| TW | I625604 | 6/2018 |
| TW | I627588 B | 6/2018 |
| TW | I631429 | 8/2018 |
| TW | M584427 | 10/2019 |
| TW | M584428 | 10/2019 |

OTHER PUBLICATIONS

Erozan "A Novel Printed-Lookup-Table-Based Programmable Printed Digital Circuit" Jun. 2020.

P. Sullivan, "Automated Generation, Fabrication and Measurement of Parametric Test Structures for Rapid Prototyping Using Optical Maskless Lithography" Apr. 6, 2002.

Zheng "Rapid Prototyping of a Dammann Grating in DMD-Based Maskless Lithography" Dec. 2019.

Sekhar "Evaluation of Materials for Fan-Out Panel Level Packaging (FOPLP) Applications" 2018.

Martin "Parallel raster image processor for PCB manufacturing" 1994.

Schein "Process Modules for High-Density Interconnects in Panel-Level Packaging" Jan. 2020.

* cited by examiner

| FA₁ | FA₂ | FA₃ | FB₁ | FB₂ | FB₃ |
|---|---|---|---|---|---|
| FA₄ | XA | FA₅ | FB₄ | XB | FB₅ |
| FA₆ | FA₇ | FA₈ | FB₆ | FB₇ | FB₈ |

METHOD AND SYSTEM FOR GENERATING AND UPDATING POSITION DISTRIBUTION GRAPH

CROSS-REFERENCE TO RELATED APPLICATIONS

This non-provisional application claims priority under 35 U.S.C. § 119(a) on Patent Application No(s). 109144899 filed in Taiwan, ROC on Dec. 18, 2018, the entire contents of which are hereby incorporated by reference.

BACKGROUND

1. Technical Field

The present disclosure relates to method and system for generating and updating position distribution graph.

2. Related Art

With the development of the printed circuit board (PCB) industry and the touch panel industry, their application become wider. As the computing power of the central processing unit of electronic products increases, the structure of electronic device becomes more complex, more components with lighter weight and smaller size are needed, components and traces are arranged more densely on the PCB. Therefore, the line width and line spacing between traces become smaller on the PCB. In the future circuit board market, the demand for line width or line spacing may shrink from 150 micrometers to 10 micrometers, and product designs of next-generation may even be smaller than 5 micrometers. When the development of PCBs moves towards the trend of high density interconnect (HDI) boards or multi-layer boards, the requirements for circuit line width and alignment accuracy on PCBs become higher. Therefore, the emerging direct imaging technology has also received increasing attention from the industry.

SUMMARY

According to one or more embodiment of the present disclosure, a method for generating and updating position distribution graph comprises: generating at least one position distribution graph according to a circuit bitmap and an exposure pattern; wherein the circuit bitmap comprises a plurality of target pixels and a plurality of background pixels, each of said at least one position distribution graph comprises a plurality of position points, the plurality of position points locates at a part of the plurality of target pixels and are associated with the exposure pattern; performing an exposure simulation according to each of said at least one position distribution graph to generate at least one exposure result graph, wherein the exposure simulation comprises forming a virtual spot according to each of the plurality of position points of each of said at least one position distribution graph; comparing the circuit bitmap with said at least one exposure result graph to generate at least one error distribution candidate graph; selecting one of the error distribution candidate graph to serve as an error distribution graph, wherein the error distribution graph comprises a plurality of error pixels; and performing a zero-one integer programming according to the circuit bitmap and at least one of the plurality of error pixels to update one of said at least one position distribution graph, wherein the updated position distribution graph comprises a plurality of correcting position points and is associated with the selected error distribution graph.

According to one or more embodiment of the present disclosure, a system for generating and updating position distribution graph comprises: a non-transitory machine readable medium storing a plurality of instructions, and a processing device electrically connecting to the non-transitory machine readable medium, wherein the processing device performs the plurality of instructions and triggers a plurality of operations, and the plurality of operations comprises: generating at least one position distribution graph according to a circuit bitmap and an exposure pattern; wherein the circuit bitmap comprises a plurality of target pixels and a plurality of background pixels, each of said at least one position distribution graph comprises a plurality of position points, the plurality of position points locates at a part of the plurality of target pixels and are associated with the exposure pattern; performing an exposure simulation according to each of said at least one position distribution graph to generate at least one exposure result graph, wherein the exposure simulation comprises forming a virtual spot according to each of the plurality of position points of each of said at least one position distribution graph; comparing the circuit bitmap with said at least one exposure result graph to generate at least one error distribution candidate graph; selecting one of the error distribution candidate graph to serve as an error distribution graph, wherein the error distribution graph comprises a plurality of error pixels; and performing a zero-one integer programming according to the circuit bitmap and at least one of the plurality of error pixels to update one of said at least one position distribution graph, wherein the updated position distribution graph comprises a plurality of correcting position points and is associated with the selected error distribution graph.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein:

FIG. 16 is an example of the pixel group;

FIG. 17 is a schematic diagram of verifying pixels determined according correcting pixels in FIG. 16;

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Digital direct imaging exposure machine directly exposes the computer-aided manufacture (CAM) data on the substrate of the printed circuit board (PCB), thereby saving the film procedure in the exposure process, reducing the deviation caused by the expansion and contraction of the film, and improving the yield rate of PCBs.

In a digital direct imaging system with a laser array, in order to obtain high-quality exposed images, in addition to accurately controlling and correcting the scanning timing, the power of the laser array will also affect the image quality. One way is to use a power meter to detect and adjust the laser power output. However, the exposure result may have non-uniform parts under the requirements of high-accuracy imaging quality. This phenomenon involves individual laser spot profile and light photoresist threshold effect. Because the laser array system includes different laser sources and has different spot distribution, even if each laser source has the same power, the distribution is not easy to be uniform. Further, when the accuracy requirement reaches is very high, even the ideal laser spot has a complex spot distribution and characteristics in optical physics, and can hardly be regarded as a pure mathematical model. In addition, due to the reduction of line width of a circuit bitmap, a smaller spot is required for exposing a small line width. However, reducing the size of the laser spot may cause the diffraction limit to violate physical limitations, when the line width of the circuit bitmap is smaller than the spot, the exposure accuracy may be insufficient. In an embodiment of the present disclosure, a larger light spot can be used to expose a small line width to improve the accuracy of the circuit bitmap.

The method and system for generating and updating position distribution graph proposed in an embodiment of the disclosure is adapted to calculate a position distribution graph before the laser direct imaging exposure machine processes the PCB. The position distribution graph is configured to indicate whether a pixel of every position in the circuit bitmap has to be exposed or not.

Figure 1:
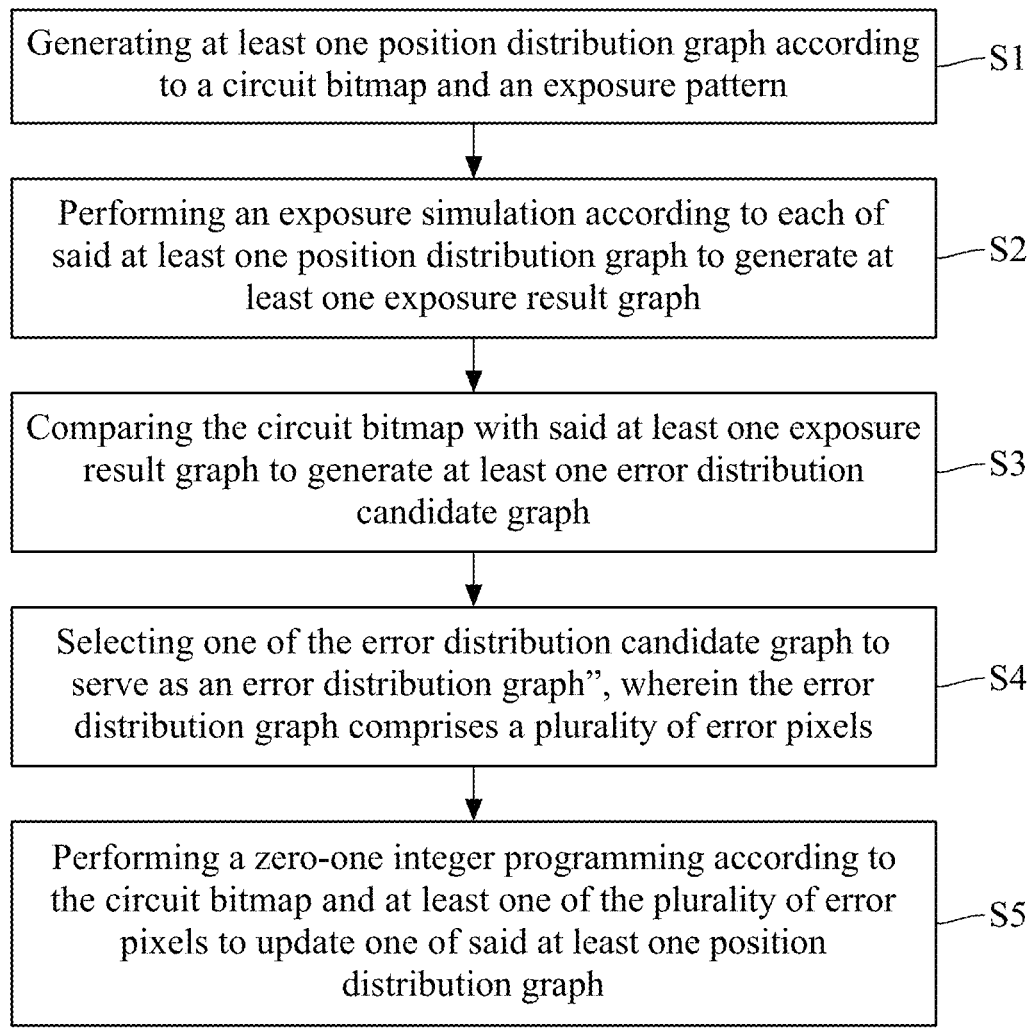
FIG. 1 is a flowchart of the method for generating and updating position distribution graph according to an embodiment of the present disclosure.

FIG. 1 is a flowchart of the method for generating and updating position distribution graph according to an embodiment of the present disclosure. Step S1 shows that "generating at least one position distribution graph according to a circuit bitmap and an exposure pattern", wherein the circuit bitmap comprises a plurality of target pixels and a plurality of background pixels, each of said at least one position distribution graph comprises a plurality of position points, the plurality of position points locates at a part of the plurality of target pixels and are associated with the exposure pattern. It should be noticed that said "at least one" mentioned in step S1 and following description refers to "one or more".

Figure 2:
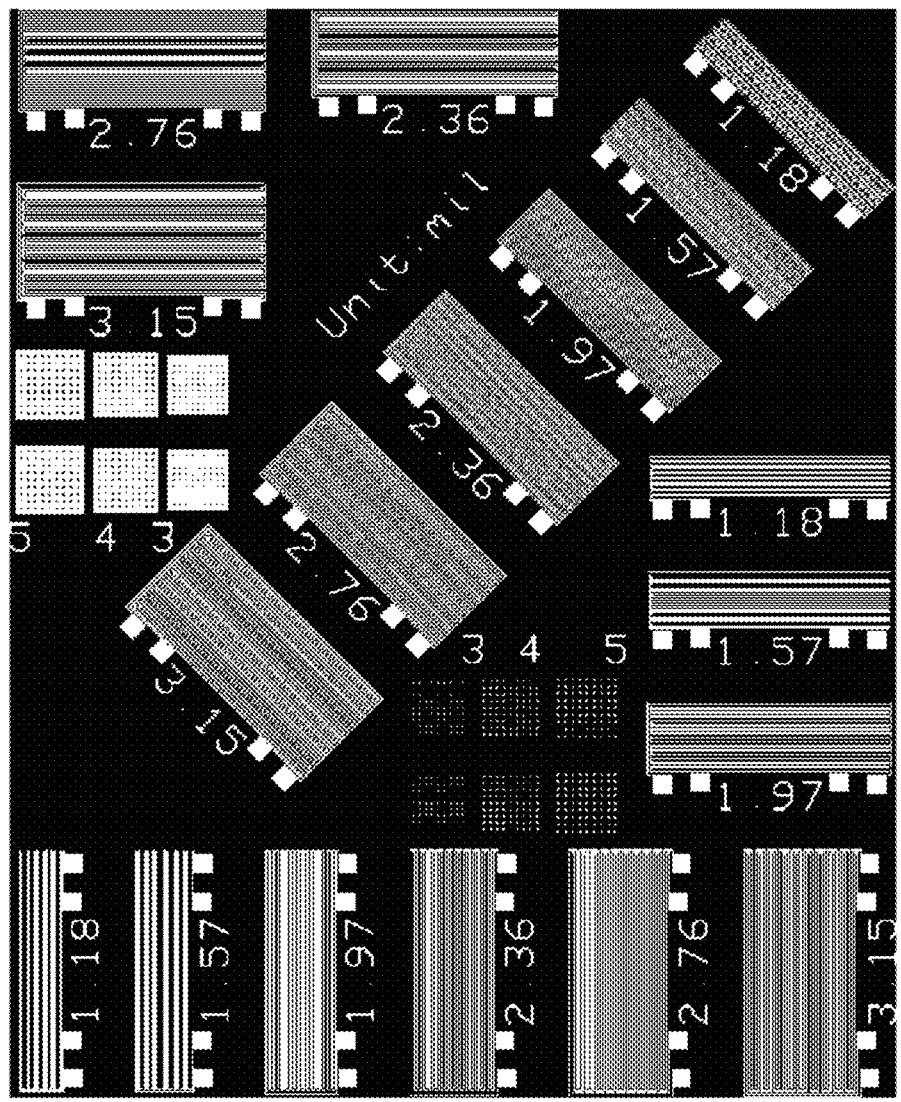
FIG. 2 is an example of the circuit bitmap.

For example, target pixels and background pixels are arranged in a matrix form. In an embodiment, the plurality of target pixels forms a circuit structure, and the plurality of background pixels forms a substrate structure. FIG. 2 is an example of the circuit bitmap, wherein a white part consists of multiple target pixels and a black part consists of multiple background pixels. Each of the plurality of target pixels and the plurality of background pixels has an exposure state, the exposure state of each of the plurality of target pixels is at a first exposure level (highly exposed), and the exposure state of each of the plurality of background pixels is at a second exposure level lower than the first exposure level (low exposed).

Figure 3:
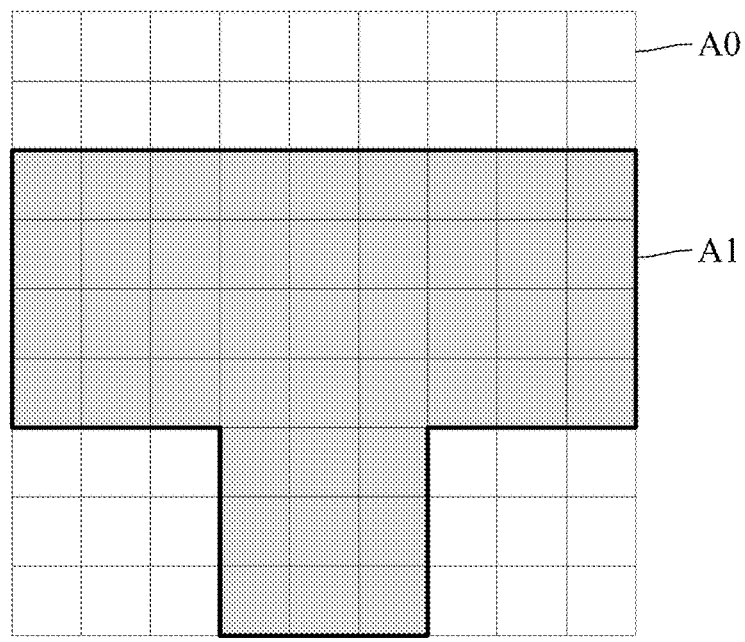
FIG. 3 is a simplified example of the circuit bitmap.

In an embodiment, a dose threshold is the minimum energy value that hardens the photosensitive material during exposure. The exposure of a pixel is highly exposed when the required exposure dose value is more than the dose threshold. The exposure state of a pixel is low exposed when required exposure dose value is less than the dose threshold. FIG. 3 is a simplified example of the circuit bitmap, wherein each grid represents a pixel, the white grid represents the background pixel and the colored grid represents the target pixel. The planar region A0 of the circuit bitmap is 81 pixels, wherein 45 pixels form a target shape A1, which is T-shape and represents a circuit structure.

Figure 4:
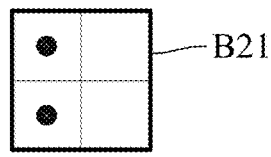
FIG. 4 is an example of the exposure pattern.

The exposure pattern provides a basic rule arranging position points in the circuit bitmap. FIG. 4 is an example of the exposure pattern B21. The area occupied by the exposure pattern B21 in FIG. 4 is called "basic region". In an embodiment, the length and width of the basic region are two pixels. Black dots in the exposure pattern B21 represent position points. "At least one exposure pattern" mentioned in step S1 can be a fixed exposure pattern or multiple exposure pattern candidates. The following first explains how a position distribution graph is generated in step S1 according to the circuit bitmap of FIG. 3 and the exposure pattern of FIG. 4, and then introduces multiple exposure pattern candidates.

Figure 5:
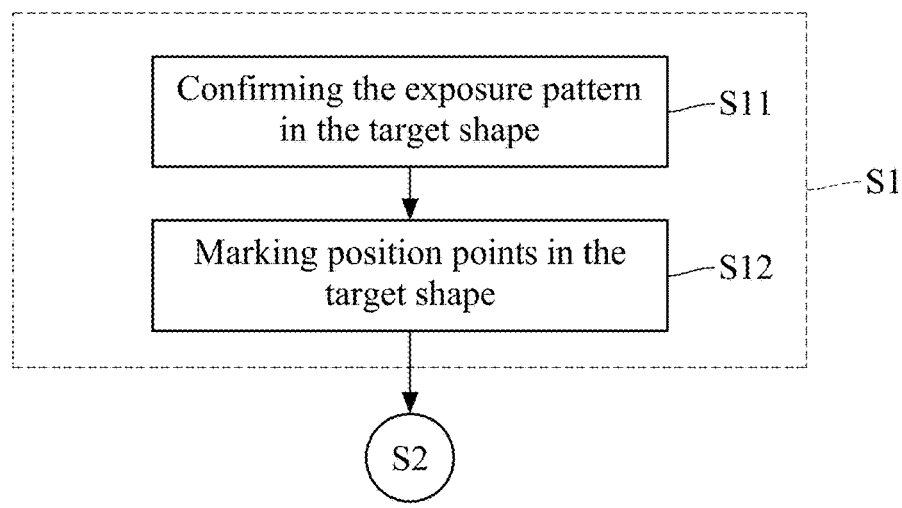
FIG. 5 is a detailed flow chart of step S1 in FIG. 1.
Figure 6:
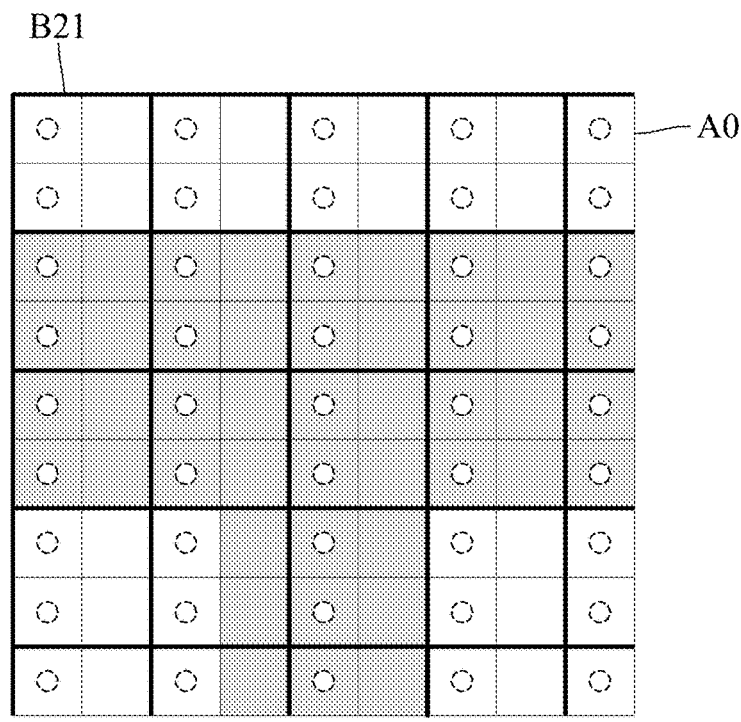
FIG. 6 is an example of step S11 in FIG. 5.

FIG. 5 is a detailed flow chart of step S1 in FIG. 1. Step S11 shows that "confirming the exposure pattern in the target shape". FIG. 6 is an example of step S11 in FIG. 5 Starting from the upper left corner, the example in FIG. 6 uses the exposure pattern B21 to cover the entire planar region A0 from left to right and from top to bottom, as shown by the thick grid. The pixels at the lower boundary and the right boundary of the planar area A0 are covered with part of the basic region to avoid exceeding the boundary.

Figure 7:
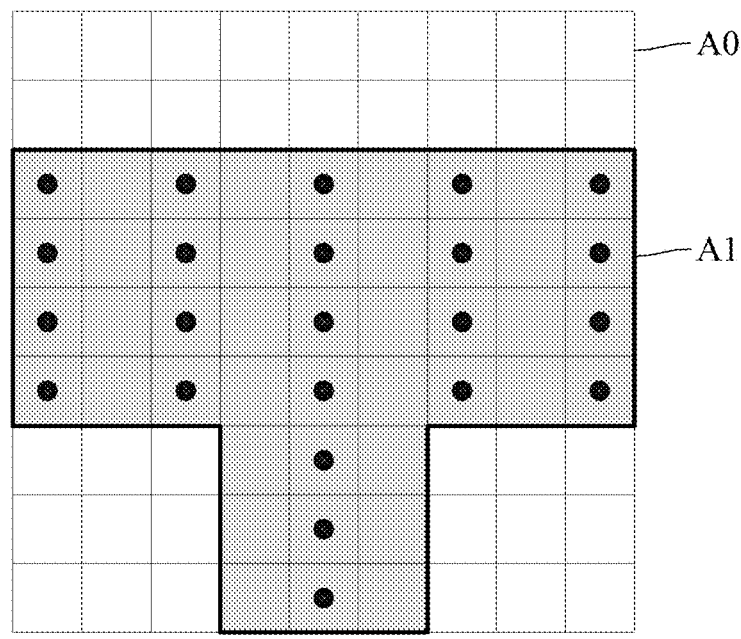
FIG. 7 is an example of step S12 in FIG. 5.

Step S12 shows that "marking position points in the target shape". FIG. 7 is an example of step S12 in FIG. 5. The target shape A1 consists to colored grids shown in FIG. 7. Regarding exposure patterns B21 overlapped with the target shape A1, step S12 marks position points to target pixels inside the target shape A1 according to position points arranged in the exposure pattern B21. FIG. 7 shows all position points located at target pixels, these position points forms a position distribution graph. The position distribution graph comprises a plurality of position points, and the plurality of position points locates at a part of the plurality of target pixels.

Figure 8:
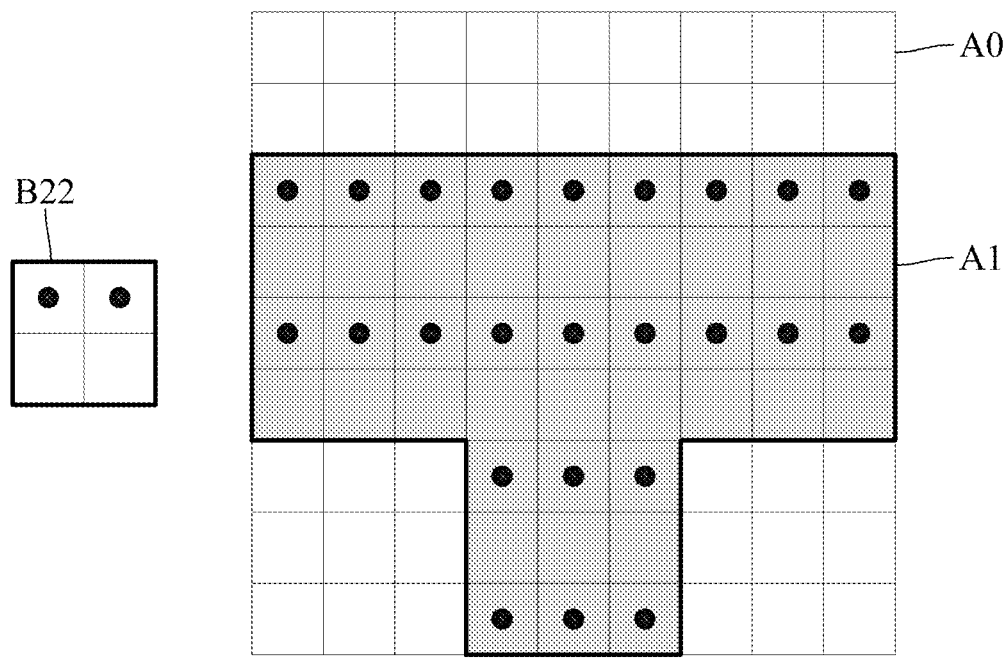
FIG. 8 and FIG. 9 show another two examples of exposure patterns and their mark results of position points.
Figure 9:
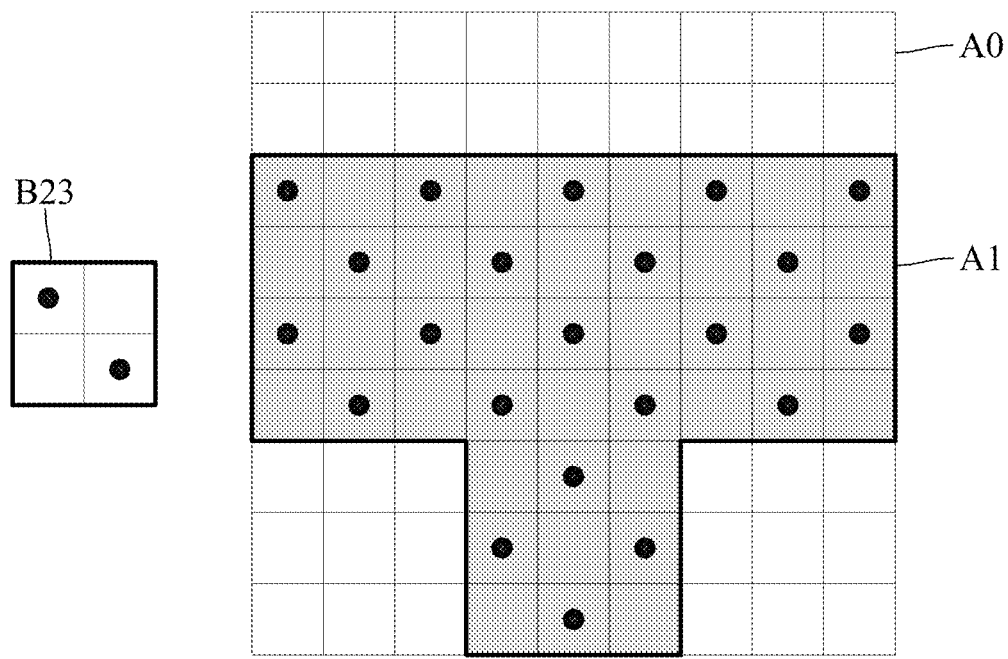
Figure 10A:
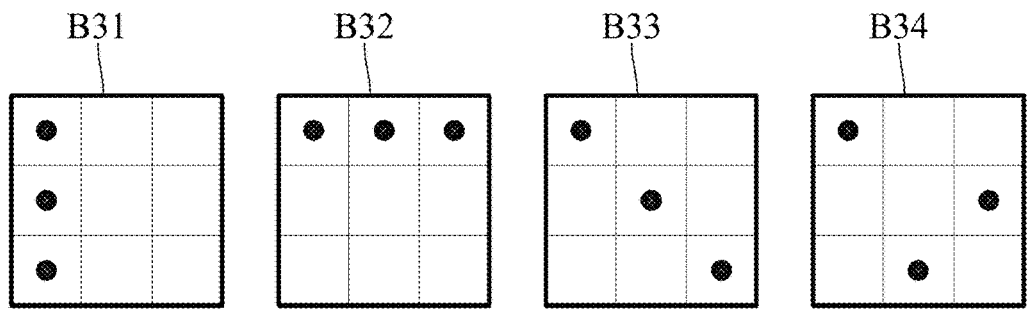
FIG. 10A shows four examples of the exposure patterns whose length and width are 3 pixels.
Figure 10B:
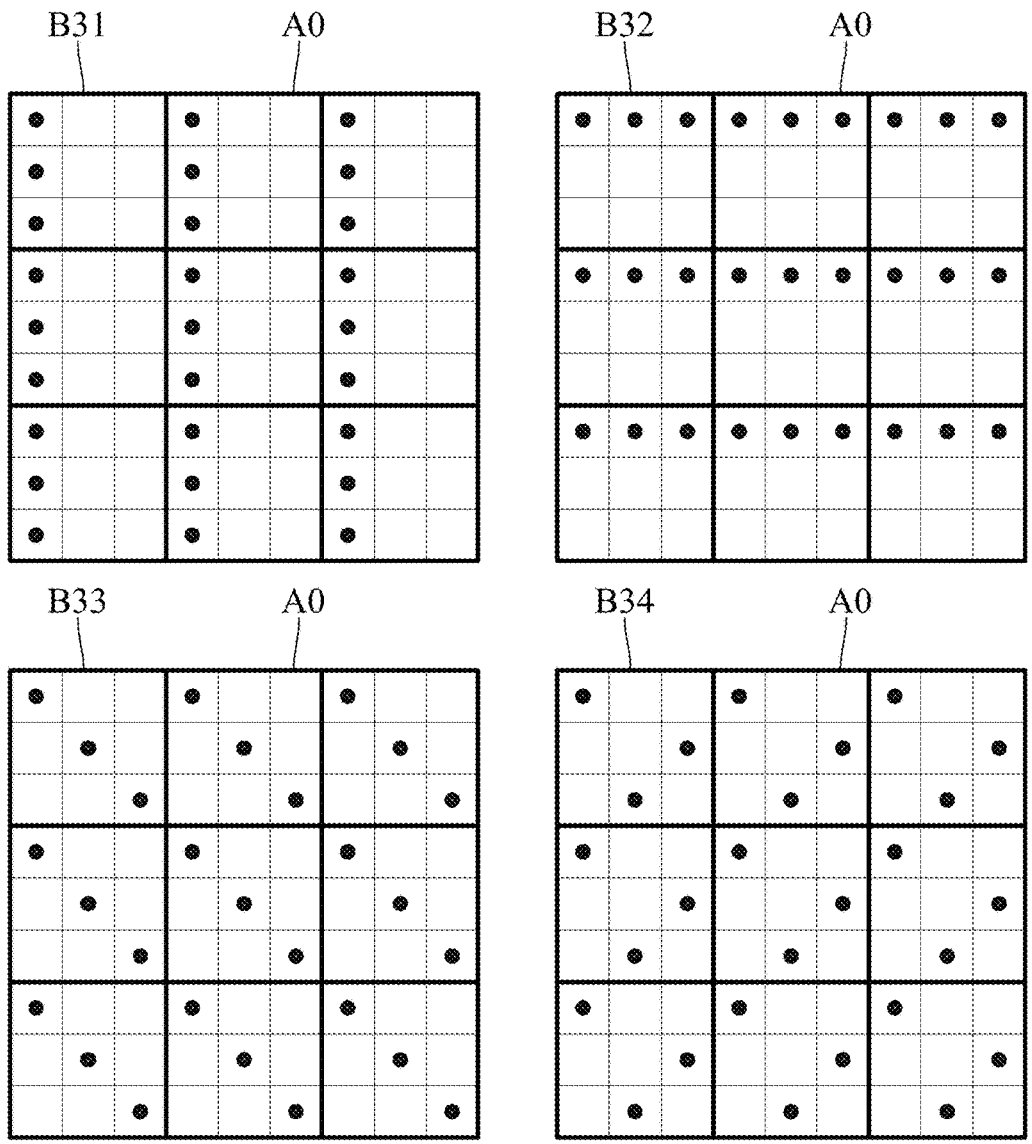
FIG. 10B is a schematic diagram showing planar regions covered with four exposure patterns of FIG. 10A.
Figure 11A:
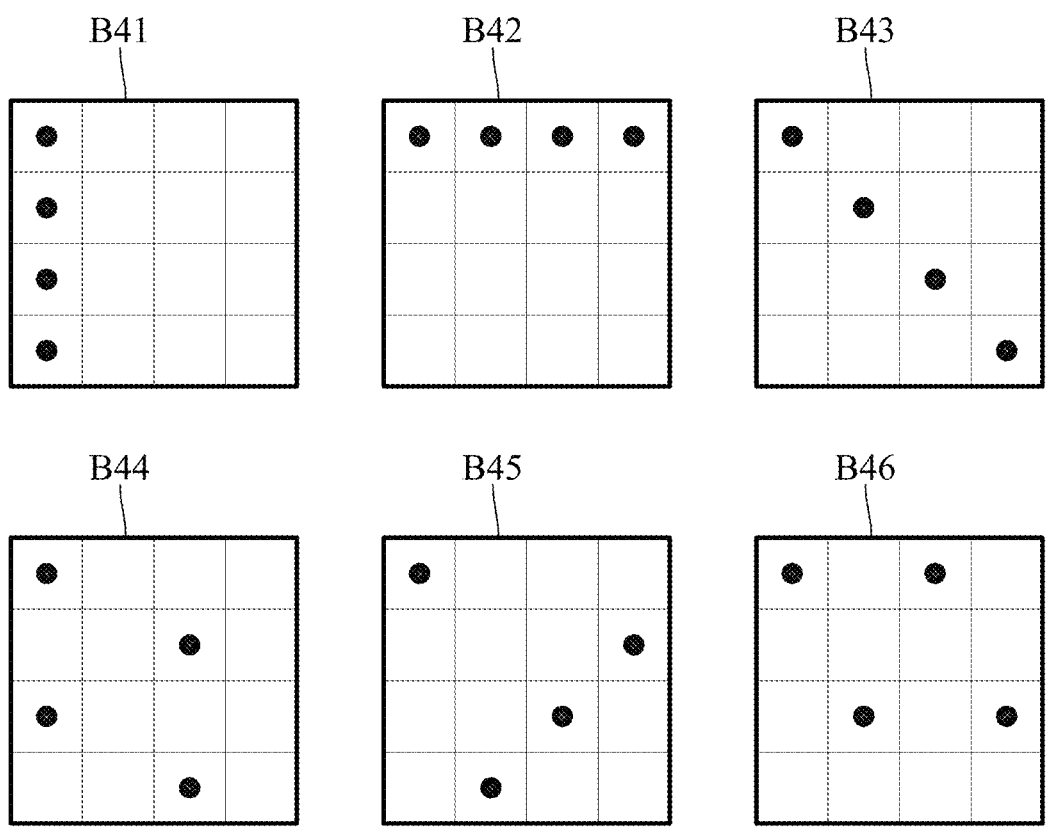
FIG. 11A shows six examples of the exposure patterns whose length and width are 4 pixels.
Figure 11B:
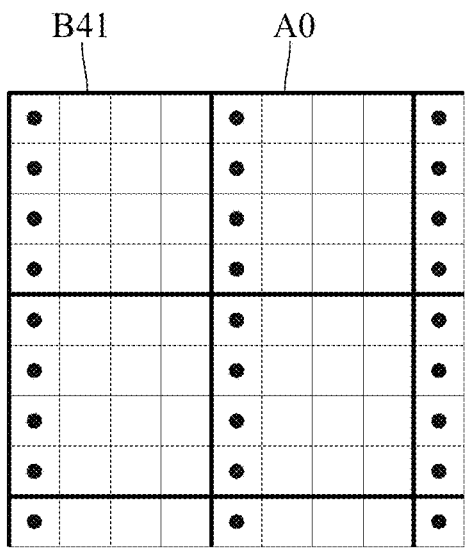
FIG. 11B is a schematic diagram showing planar regions covered with size exposure patterns of FIG. 11A.
Figure 11B:
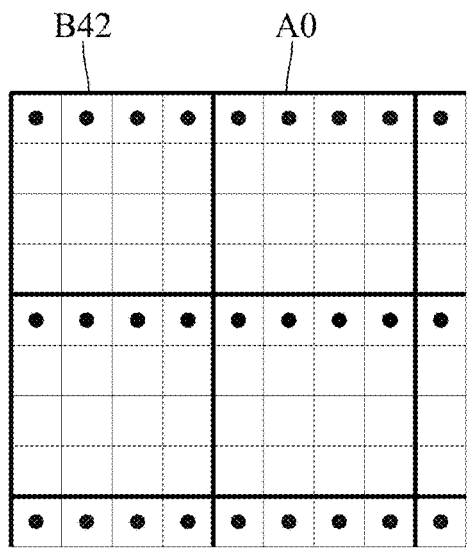
Figure 11B:
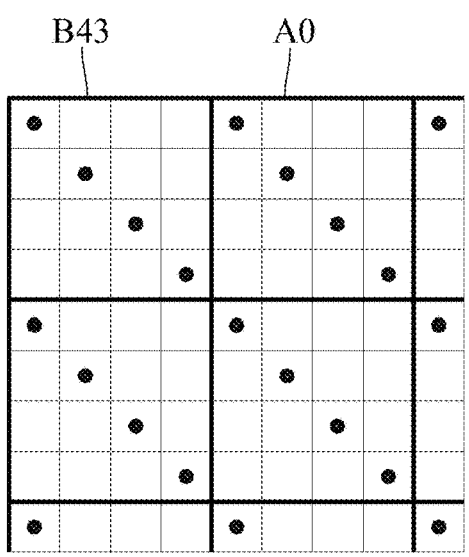
Figure 11B:
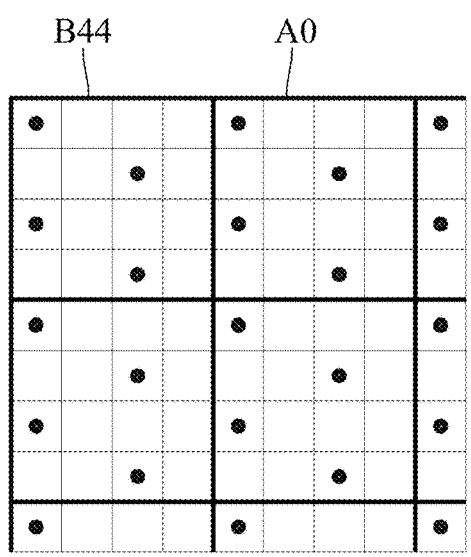
Figure 11B:
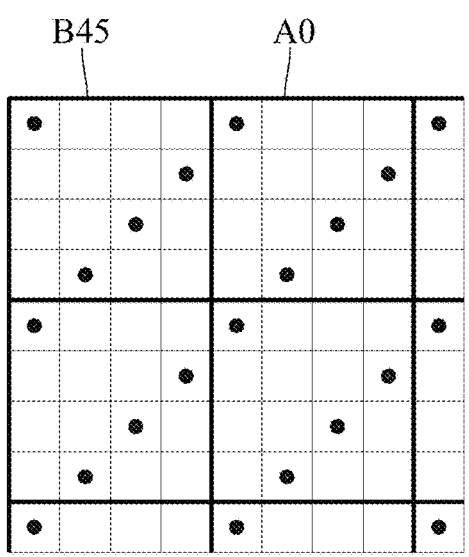
Figure 11B:
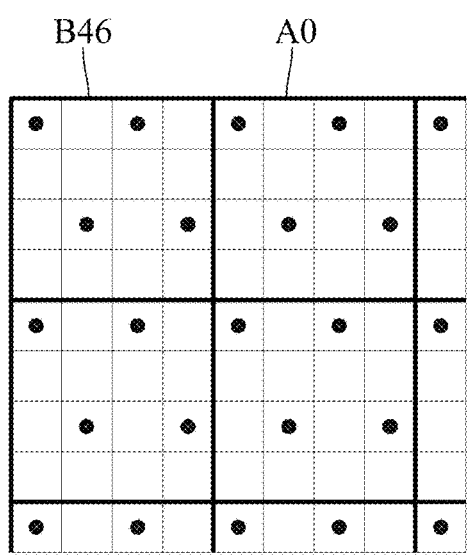

In an embodiment of the present disclosure, the exposure pattern whose length and width are both k pixels is called "k×k exposure pattern". The present disclosure does not limit the value of k. For example, every target pixel will be marked when the position distribution graph is generated according to 1×1 exposure pattern. FIG. 8 and FIG. 9 show another two examples of exposure patterns B22, B23 and position distribution graphs generated according to these two examples. FIG. 10A shows four examples B31-B34 of the 3×3 exposure patterns. FIG. 10B is a schematic diagram showing planar regions A0 covered with four exposure patterns B31-B34 of FIG. 10A. FIG. 11A shows six examples B41-B46 of the 4×4 exposure patterns. FIG. 11B is a schematic diagram showing planar regions A0 covered with six exposure patterns B41-B46 of FIG. 11A. In other examples of the exposure patterns, the length and the width of the basic region may be different.

The present disclosure does not limit the arrangement of multiple position points in the position distribution graph. In an embodiment, a distance between two of the plurality of position points is larger than or equal to a length or a width of one of the plurality of target pixels. In other words, two position points are separated by more than one pixel in the horizontal direction, or two position points are separated by more than one pixel in the vertical direction. Taking FIG. 10B as the example, two position points on the same row are separated by 2 pixels in the planar region A0 arranged with the exposure pattern B31. Taking FIG. 11B as the example, two position points on the same column are separated by 3 pixels in the planar region A0 arranged with the exposure pattern B45.

Please refer to FIG. 1. Step S2 shows that "performing an exposure simulation according to each of said at least one position distribution graph to generate at least one exposure result graph", wherein the exposure simulation comprises forming a virtual spot according to each of the plurality of position points of each of said at least one position distribution graph to generate at least one exposure result graph. The exposure simulation uses the software to simulate a virtual laser source, this virtual laser source forms a virtual spot according to every position point in the position distribution graph, thereby simulating the exposure behavior of the real laser source and generating exposure result graph.

In an embodiment, the number of exposure patterns, position distribution graphs and exposure result graphs are all equal. If one exposure pattern is adopted in step S1, one position distribution graph will be generated, and one exposure result graph will be generated according to the position distribution graph in step S2. If multiple exposure pattern candidates are adopted in step S1, multiple position distribution graphs will be generated, and multiple exposure result graphs will be generated in step S2.

In an embodiment, a length or a width of each of the plurality of target pixels and the plurality of background pixels is smaller than a diameter of the virtual spot. In other words, the diameter of the virtual spot is larger than the size of any pixels of the circuit bitmap. However, the present disclosure is not limited thereto.

Each of said at least one exposure result graph comprises a plurality of exposure results, each of the plurality of exposure results corresponds to one of the plurality of target pixels and the plurality of background pixels. In other words, the exposure result graph and the circuit bitmap are similar. The value of every pixel in the circuit bitmap represents the expected exposure dose of this pixel. The value of every pixel in the exposure result graph represents the cumulative dose of this pixel after an exposure simulation. In an embodiment, since the area of a virtual spot is larger than the area of a pixel, when the distance between two position points is not larger than the diameter of the virtual spot, two virtual spots formed according to these two position points have an overlapped region, and each pixel inside this overlapped region has the cumulative dose of said two virtual spots.

Please refer to FIG. 1. Step S3 shows that "comparing the circuit bitmap with said at least one exposure result graph to generate at least one error distribution candidate graph". Step S4 shows that "selecting one of the error distribution candidate graph to serve as an error distribution graph", wherein the error distribution graph comprises a plurality of error pixels.

The number of error distribution candidate graphs depends on the number of exposure patterns. If one exposure pattern is adopted in step S1, one error distribution candidate graph will be generated in step S3 according to one exposure result graph generated in step S2, and the error distribution graph generated in S4 is the error distribution candidate graph of step S3. The following first explains the format of the error distribution graph, and then explains how error distribution candidate graphs are generated in step S3, and then how to select one from multiple error distribution candidate graphs generated in step S3 to serve as the error distribution graph mentioned in step S4.

The error distribution graph comprises a plurality of error pixels, and each error pixel corresponds to one of exposure results. As mentioned above, each exposure result corresponds to one of target pixels and background pixels, so the error pixel also corresponds to one of target pixels and background pixels. When one of the plurality of error pixels corresponds to said one of the plurality of background pixels, another one of the plurality of exposure results corresponding to said one of the plurality of error pixels is at the first exposure level (highly exposed). When one of the plurality of error pixels corresponds to said one of the plurality of target pixels, one of the plurality of exposure results corresponding to said one of the plurality of error pixels is at the second exposure level lower than the first exposure level (low exposed). In other words, error pixels comprise those target pixels that are expected to be exposed but are not successfully exposed, and those background pixels that are not expected to be exposed but are exposed.

An embodiment for generating an error distribution graph is as follows. A processor compares each exposure result of the exposure result graph with the exposure state of each pixel in the circuit bitmap. For example, the processor performs a binarization according to the exposure state of each pixel in the circuit bitmap so as to generate a first matrix, performs the binarization according to each exposure result of the exposure result graph so as to generate a second matrix, and then perform an exclusive-or operation (XOR) according to the first matrix and the second matrix to generate the error distribution graph. The error distribution graph generated according to the above example is a Boolean matrix, where the value of the element corresponding to the error pixel is 1 and the value of the element corresponding the non-error pixel is 0. The binarization in the above example comprises the following two operations: the matrix element will be marked as 1 if the cumulative dose of a pixel is greater than or equal to the dose threshold of the pixel, and the matrix element will be marked as 0 is the cumulative dose of a pixel is smaller than the dose threshold of the pixel.

If at least one exposure pattern mentioned in step S1 comprises a plurality of exposure pattern candidates, such as B21-B23 shown in FIG. 4, FIG. 8 and FIG. 9, B31-B34 shown in FIG. 10A, and B41-B46 shown in FIG. 11A, a plurality of position distribution graphs will be generated in step S1, a plurality of exposure result graphs will be generated in step S2, a plurality of error distribution candidate graphs will be generated in step S3, and each error distribution candidate graph have an error number indicating the number of error pixels. Therefore, in an embodiment of step S4, the processor determines a smallest one of the plurality of error numbers and selects one of said at least one error distribution candidate graph to serve as the error distribution graph, with the selected error distribution candidate graph having the smallest error number. In short, the error distribution candidate graph with the minimal error number is selected to serve as the error distribution graph in step S4.

For example, in step S1, 1×1 exposure pattern and multiple exposure pattern candidates B21-B46 shown in FIGS. 4 and 8-11 are adopted, the plurality of error numbers calculated in step S4 are listed in the following table.

TABLE 1

| Exposure pattern candidate | Error number |
| --- | --- |
| 1 × 1 | 5819942 |
| B21 | 2347445 |
| B22 | 1847766 |
| B23 | 2783945 |
| B31 | 1540662 |
| B32 | 1534771 |
| B33 | 919520 |
| B34 | 203323 (minimum) |
| B41 | 5135068 |
| B42 | 5455178 |
| B43 | 4536068 |
| B44 | 5496023 |
| B45 | 5135068 |
| B46 | 5051078 |

The smaller the error number is, the fewer calculation required for the subsequent steps. As shown in Table 1, the error distribution candidate graph generated by adopting the exposure pattern candidate B34 has the least error pixels. Therefore, the error distribution candidate graph corresponding to the exposure pattern candidate B34 is served as the error distribution graph for processing in the following steps.

Please refer to FIG. 1, step S5 shows that "performing a zero-one integer programming according to the circuit bitmap and at least one of the plurality of error pixels to update one of said at least one position distribution graph", wherein the updated position distribution graph comprises a plurality of correcting position points and the updated position distribution graph is associated with the selected error distribution graph. Basically, step S5 includes the following three stages. Stage 1, "selecting at least one of the plurality of error pixels of the error distribution graph to perform a dilation operation to determine a plurality of correcting pixels in said one of said at least one position distribution graph". Stage 2, "determining a plurality of verifying pixels in said one of said at least one position distribution graph by performing the dilation operation according to each of the plurality of correcting pixels". Stage 3, "performing the zero-one integer programming according to the circuit bitmap, said at least one of the plurality of error pixels, the plurality of correcting pixels and the plurality of verifying pixels to update said one of said at least one position distribution graph".

The following shows three embodiments of step S5. The first embodiment processes at least one error pixel in the error distribution graph. The second embodiment processes a pixel group in the error distribution graph, wherein the pixel group comprises a plurality of error pixels, and the plurality of correcting pixels obtained by performing the dilation operation according to these error pixels has a connection property. The third embodiment processes the pixel group mentioned in the second embodiment, wherein the number of pixels in this pixel group exceeds a computation power of the processor, and thus the third embodiment further comprises a mechanism to process multiple pixels in a large pixel group in batches. In the third embodiment, the number of batches and the number of pixels depend on processing power of hardware such as processor and memory, and the present disclosure does not limit thereof.

Figure 12:
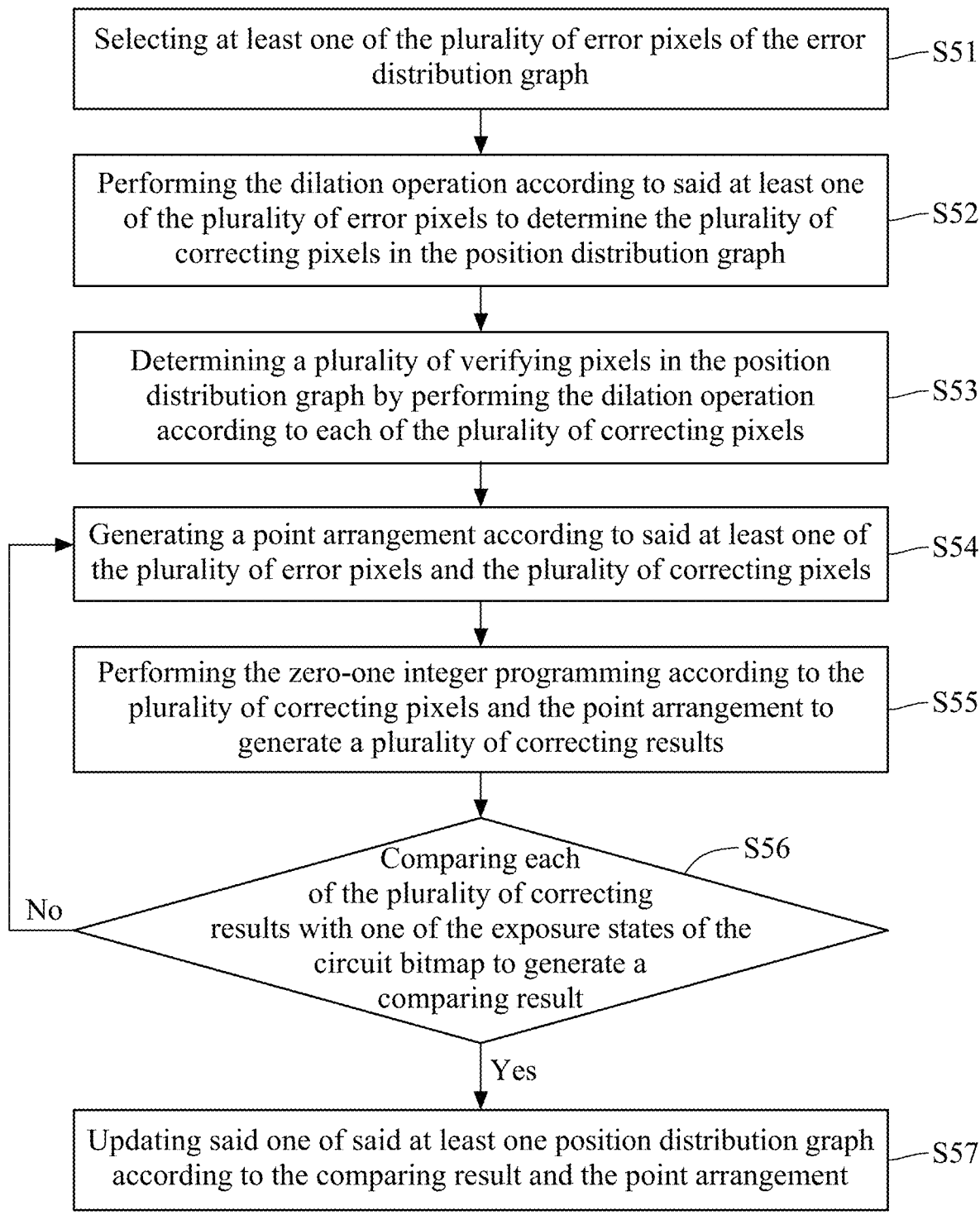
FIG. 12 is a flowchart of the first embodiment of step S5 in FIG. 1.

FIG. 12 is a flowchart of the first embodiment of step S5 in FIG. 1. In an embodiment, the process of FIG. 12 may be repeatedly performed according to the number of error pixels, or the process of FIG. 12 may be performed by multiple processors simultaneously, and the disclosure does not limit thereto. Steps S51 and S52 correspond to aforementioned stage 1, steps S53 corresponds to aforementioned stage 2, and steps S54-57 correspond to aforementioned stage S3.

Step S51 shows that "selecting at least one of the plurality of error pixels of the error distribution graph". In an embodiment, step S51 may be performed in parallel if the distance between two of multiple error pixels selected at the same time is greater than the diameter of the virtual spot.

Step S52 shows that "performing the dilation operation according to said at least one of the plurality of error pixels to determine the plurality of correcting pixels in the position distribution graph". The dilation operation of step S52 takes each error pixel as the center, and determines multiple pixels covered by the radius of the virtual spot as correcting pixels in the position distribution graph. The correcting pixels comprises error pixels. The distance between each correcting pixel and the error pixel is not greater than the radius of the virtual spot.

Figure 13A:
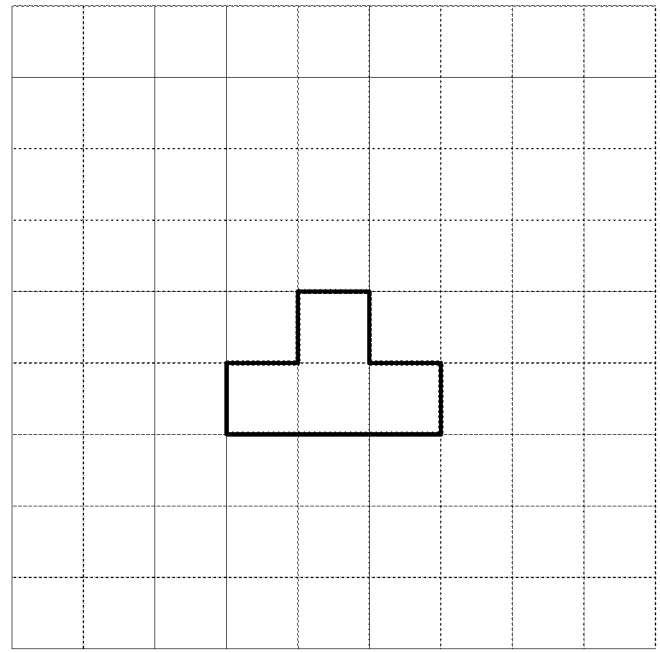
FIG. 13A is a simplified example of the circuit bitmap.
Figure 13B:
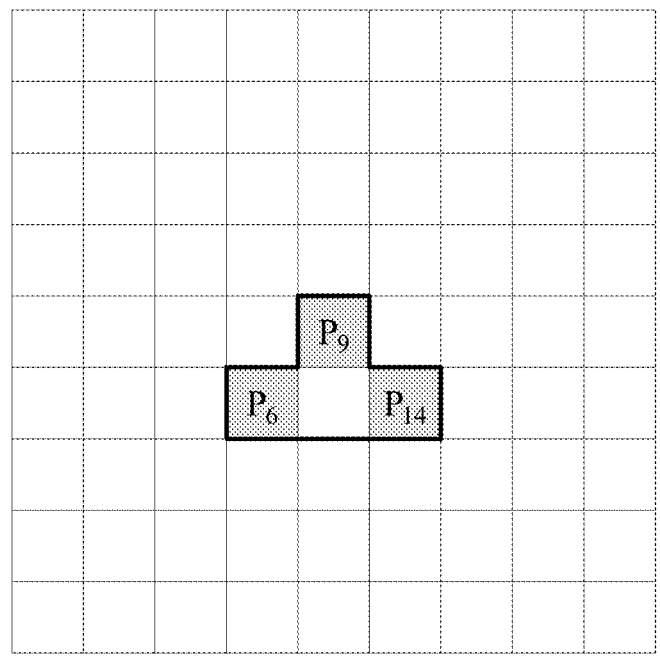
FIG. 13B is an example of error distribution graph selected according to FIG. 13A and step S4 in FIG. 1.
Figure 13C:
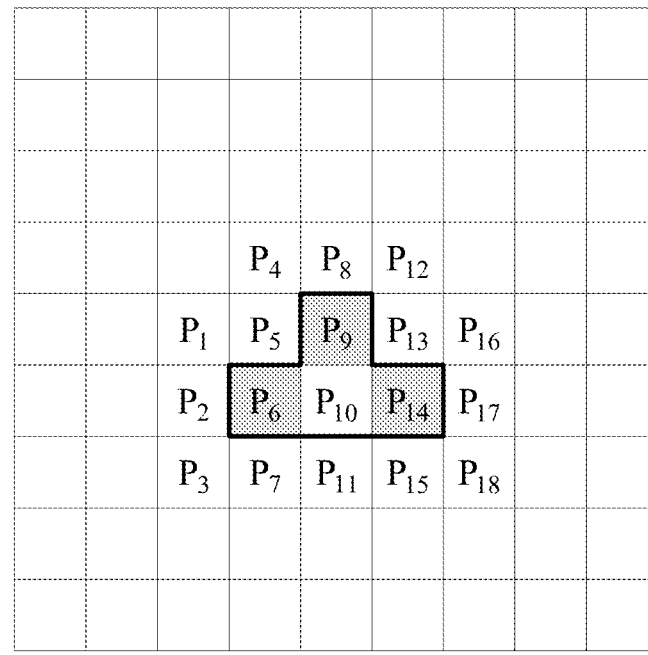
FIG. 13C is a schematic diagram of error pixels and correcting pixels.

FIG. 13A is a simplified example of the circuit bitmap, wherein the grids in the T-shape enclosed by thick lines represent target pixels. FIG. 13B is an example of error distribution graph selected according to FIG. 13A and step S4 in FIG. 1, wherein grids marked $P_6$, $P_9$, and $P_{14}$ represent error pixels. After steps S51-52 are performed according to FIG. 13B, please refer to FIG. 13C, which shows a schematic diagram of error pixels and correcting pixels, wherein grids marking $P_1$-$P_5$, $P_7$-$P_8$, $P_{10}$-$P_{13}$ and $P_{15}$-$P_{18}$ represent correcting pixels except error pixels. In other words, correcting pixels comprises $P_1$-$P_{18}$. In this embodiment, the radius of the virtual spot is the length or the width of one pixel. However, the present disclosure does not limit thereof.

Figure 14:
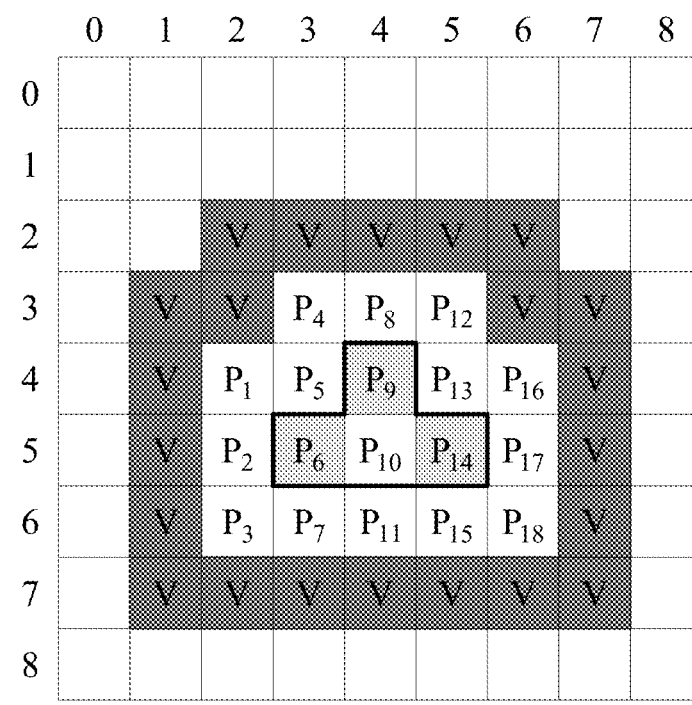
FIG. 14 is a schematic diagram of verifying pixels determined according to correcting pixels in FIG. 13C.

Step S53 shows that "determining a plurality of verifying pixels in the position distribution graph by performing the dilation operation according to each of the plurality of correcting pixels". The dilation operation of step S53 takes each of the error pixels $P_1$-$P_{18}$ as the center, and determines multiple pixels covered by the radius of the virtual spot as verifying pixels in the position distribution graph. The verifying pixels comprises said at least one error pixels $P_6$, $P_9$, and $P_{14}$ selected in step S51 and correcting pixels $P_1$-$P_5$, $P_7$-$P_8$, $P_{10}$-$P_{13}$ and $P_{15}$-$P_{18}$ determined in step S52. The distance between each verifying pixel and one of correcting pixels is not greater than the radius of the virtual spot. FIG. 14 is a schematic diagram of verifying pixels determined according to correcting pixels in FIG. 13C, wherein grids marking V represent verifying pixels except error pixels and correcting pixels. In other word, the verifying pixels comprises error pixels and correcting pixels $P_1$-$P_{18}$, as well as all pixels marking V.

Step S54 shows that "generating a point arrangement according to said at least one of the plurality of error pixels and the plurality of correcting pixels". In an embodiment of step S54, the point arrangement comprises a plurality of specified values, each value indicates whether a correcting pixel or an error pixel is a position point. Based on the example of FIG. 14, a zero-one matrix with 18 rows and 1 column is generated in step S54 to represent the point arrangement of 18 correcting points $P_1$-$P_{18}$ in FIG. 13. Each element in the matrix represents the value of the position point. For example, if the pixel corresponding to the element of the matrix is set as the position point, the value of element is 1; if the pixel corresponding to the element of the matrix is not set as the position point, the value of element is 0. For example, considering a zero-one matrix $[1100\ 1100\ 0000\ 0000\ 00]^T_{18\times 1}$ shows that correcting pixels $P_1$, $P_2$, $P_5$ and $P_6$ are set as position points, and the rest of correcting points $P_3$, $P_4$, $P_7$ and $P_8$-$P_{18}$ are not set as position points. In this example, the matrix's elements correspond to correcting pixels $P_1$-$P_{18}$ from top to bottom. However, the present disclosure does not limit the correspondence between correcting pixels and matrix elements. In another embodiment of step S54, correcting pixels $P_1$-$P_{18}$ are represented by a matrix of 18 variables as follows. $[X_1\ X_2\ X_3\ \ldots\ X_{18}]^T_{18\times 1}$. Each element X in this matrix has a value of 0 or 1 and these variables will be solved in step S55.

Step S55 shows that "performing the zero-one integer programming according to the plurality of correcting pixels and the point arrangement to generate a plurality of correcting results", wherein each of the plurality of correcting results indicates whether each of error pixels, correcting pixels and verifying pixels is at the first exposure level or at the second exposure level. Step S56 shows that "comparing each of the plurality of correcting results with one of the exposure states of the circuit bitmap to generate a comparing result".

For example, the dose threshold of the target pixel is 22 and the window matrix of the virtual spot is as follows.

$$\begin{bmatrix} 0.34 & 2.49 & 0.34 \\ 2.49 & 18.4 & 2.49 \\ 0.34 & 2.49 & 0.34 \end{bmatrix}$$

An example of "performing the zero-one integer programming" is to use the window matrix of the virtual spot to perform an inner product sum operation on each verifying pixel V and $P_1$-$P_{18}$ to calculate the cumulative dose value of the verifying pixel (correcting results). For example, the equation calculating the cumulative dose value of the verifying pixel $D_{14}$ is as follows.

$$D_{14}=0.34\times P_9+2.49\times P_{10}+0.34\times P_{11}+2.49\times P_{13}+18.4\times P_{14}+2.49\times P_{15}+0.34\times P_{16}+2.49\times P_{17}+0.34\times P_{18}$$

In an embodiment, a plurality of values has been set with the point arrangement in step S54, so these values are inputted into the above equation to calculate the cumulative dose value $D_{14}$. Since the verifying pixel $P_{14}$ belongs to the target pixel, its cumulative dose value $D_{14}$ has to be greater than the dose threshold 22.

The equation calculating another cumulative dose value $D_{(1,\ 3)}$ of the verifying pixel $V_{(1,\ 3)}$ is as follows.

$$D_{(1,3)}=0.34\times A_{(0,2)}+2.49\times A_{(1,2)}+0.34\times V_{(2,2)}+2.49\times A_{(0,3)}+18.4\times V_{(1,3)}+2.49\times V_{(2,3)}+0.34\times A_{(0,4)}+2.49\times V_{(1,4)}+0.34\times P_1,$$

wherein $V_{(x,y)}$ represents the verifying pixel V whose horizontal coordinate is x and the vertical coordinate is y. $A_{(x,\ y)}$ represents non-verifying pixel A whose horizontal coordinate is x and the vertical coordinate is y. Whether the non-verifying pixel A is a position point depends on the position distribution graph mentioned in step S2. The cumulative dose value $D_{(1,\ 3)}$ can be obtained by inputting the point arrangement mentioned in step S54 and the position distribution graph mentioned in step S2 into the above equation. Since the verifying pixel $V_{(1,\ 3)}$ belongs to the background pixel, its cumulative dose value $D_{(1,\ 3)}$ has to be smaller than or equal to the dose threshold 22.

In this embodiment, if the point arrangement specified in step S14 allows the cumulative dose value of each of verifying pixels V and $P_1$-$P_{18}$ to meet its corresponding dose threshold, a comparison result indicating that the point arrangement is qualified may be generated in step S56. Otherwise, the method returns to step S54 to generate another point arrangement, and then repeats the process of steps S55-S56.

In another embodiment, the present disclosure uses a matrix operation form AX≤B to represent the calculations of cumulative dose values of all verifying pixels V and $P_1$-$P_{18}$ (there are 40 pixels in this example). As mentioned in step S53, the matrix X uses variables to represent all correcting pixels $P_1$-$P_{18}$ as follows, $[X_1\ X_2\ X_3\ \ldots\ X_{18}]^T_{18\times 1}$. The matrix B is a dose threshold matrix as follows, $[22\ 22\ 22\ \ldots\ 22]^T_{40\times 1}$. The values of matrix B's elements are determined by the circuit bitmap. The matrix A is a coefficient matrix obtained by traversing all verifying pixels V and $P_1$-$P_{18}$ by the window matrix of the virtual spot, as shown in the following table. The negative coefficients in some rows means that coefficients in these rows should make the cumulative dose value of the verifying pixels greater than the dose threshold, so these coefficients are negative after shift operations.

| | $P_1$ | $P_2$ | $P_3$ | $P_4$ | $P_5$ | $P_6$ | $P_7$ | $P_8$ | $P_9$ | $P_{10}$ | $P_{11}$ | $P_{12}$ | $P_{13}$ | $P_{14}$ | $P_{15}$ | $P_{16}$ | $P_{17}$ | $P_{18}$ |
|---|---|---|---|---|---|---|---|---|---|---|---|---|---|---|---|---|---|---|
| $V_{(1,\ 3)}$ | 0.34 | | | | | | | | | | | | | | | | | |
| $V_{(1,\ 4)}$ | 2.49 | 0.34 | | | | | | | | | | | | | | | | |
| $V_{(1,\ 5)}$ | 0.34 | 2.49 | 0.34 | | | | | | | | | | | | | | | |
| $V_{(1,\ 6)}$ | | 0.34 | 2.49 | | | | | | | | | | | | | | | |
| $V_{(1,\ 7)}$ | | | 0.34 | | | | | | | | | | | | | | | |
| $V_{(2,\ 2)}$ | | | | | 0.34 | | | | | | | | | | | | | |
| $V_{(2,\ 3)}$ | 2.49 | | | | 2.49 | 0.34 | | | | | | | | | | | | |
| $P_1$ | 18.4 | 2.49 | | | 0.34 | 2.49 | 0.34 | | | | | | | | | | | |

-continued

|  | P$_1$ | P$_2$ | P$_3$ | P$_4$ | P$_5$ | P$_6$ | P$_7$ | P$_8$ | P$_9$ | P$_{10}$ | P$_{11}$ | P$_{12}$ | P$_{13}$ | P$_{14}$ | P$_{15}$ | P$_{16}$ | P$_{17}$ | P$_{18}$ |
|---|---|---|---|---|---|---|---|---|---|---|---|---|---|---|---|---|---|---|
| P$_2$ | 2.49 | 18.4 | 2.49 |  | 0.34 | 2.49 | 0.34 |  |  |  |  |  |  |  |  |  |  |  |
| P$_3$ |  | 2.49 | 18.4 |  |  | 0.34 | 2.49 |  |  |  |  |  |  |  |  |  |  |  |
| V$_{(2,7)}$ |  |  | 2.49 |  |  |  | 0.34 |  |  |  |  |  |  |  |  |  |  |  |
| V$_{(3,2)}$ |  |  |  | 2.49 |  |  |  |  | 0.34 |  |  |  |  |  |  |  |  |  |
| P$_4$ | 0.34 |  |  | 18.4 | 2.49 |  |  |  | 2.49 | 0.34 |  |  |  |  |  |  |  |  |
| P$_5$ | 2.49 | 0.34 |  | 2.49 | 18.4 | 2.49 |  |  | 0.34 | 2.49 | 0.34 |  |  |  |  |  |  |  |
| P$_6$ | −0.34 | −2.49 | −0.34 |  | −2.49 | −18.4 | −2.49 |  |  | −0.34 | −2.49 | −0.34 |  |  |  |  |  |  |
| P$_7$ |  | 2.49 | 0.34 |  |  | 2.49 | 18.4 |  |  |  | 0.34 | 2.49 | 0.34 |  |  |  |  |  |
| V$_{(3,7)}$ |  |  | 0.34 |  |  |  | 2.49 |  |  |  |  |  |  |  |  |  |  |  |
| V$_{(4,2)}$ |  |  |  | 0.34 |  |  |  |  | 2.49 |  |  | 0.34 |  |  |  |  |  |  |
| P$_8$ |  |  |  | 0.34 | 2.49 | 0.34 |  | 18.4 | 2.49 |  |  | 2.49 | 0.34 |  |  |  |  |  |
| P$_9$ |  |  |  |  | 0.34 | 2.49 | 0.34 | 2.49 | 18.4 | 2.49 |  | 0.34 | 2.49 | 0.34 |  |  |  |  |
| P$_{10}$ |  |  |  |  |  | −0.34 | −2.49 | −0.34 | −2.49 | −18.4 | −2.49 |  | −0.34 | −2.49 | −0.34 |  |  |  |
| P$_{11}$ |  |  |  |  |  |  | 0.34 | 2.49 |  | 2.49 | 18.4 |  |  | 0.34 | 2.49 |  |  |  |
| V$_{(4,7)}$ |  |  |  |  |  |  | 0.34 |  |  |  | 2.49 |  |  |  |  |  |  |  |
| V$_{(5,2)}$ |  |  |  |  |  |  |  | 0.34 |  |  |  | 2.49 |  |  |  |  |  |  |
| P$_{12}$ |  |  |  |  |  |  |  | 2.49 | 0.34 |  |  | 18.4 | 2.49 |  |  | 0.34 |  |  |
| P$_{13}$ |  |  |  |  |  |  |  | 0.34 | 2.49 | 0.34 |  | 2.49 | 18.4 | 2.49 |  | 2.49 | 0.34 |  |
| P$_{14}$ |  |  |  |  |  |  |  |  | −0.34 | −2.49 | −0.34 |  | −2.49 | −18.4 | −2.49 |  | −2.49 | −0.34 |
| P$_{15}$ |  |  |  |  |  |  |  |  |  | 0.34 | 2.49 |  |  | 2.49 | 18.4 |  | 0.34 | 2.49 |
| V$_{(5,7)}$ |  |  |  |  |  |  |  |  |  |  | 0.34 |  |  |  | 2.49 |  |  | 0.34 |
| V$_{(6,2)}$ |  |  |  |  |  |  |  |  |  |  |  | 0.34 |  |  |  |  |  |  |
| V$_{(6,3)}$ |  |  |  |  |  |  |  |  |  |  |  | 2.49 | 0.34 |  |  | 2.49 |  |  |
| P$_{16}$ |  |  |  |  |  |  |  |  |  |  |  | 0.34 | 2.49 | 0.34 |  | 18.4 | 2.49 |  |
| P$_{17}$ |  |  |  |  |  |  |  |  |  |  |  |  | 0.34 | 2.49 | 0.34 | 2.49 | 18.4 | 2.49 |
| P$_{18}$ |  |  |  |  |  |  |  |  |  |  |  |  |  | 0.34 | 2.49 |  | 2.49 | 18.4 |
| V$_{(6,7)}$ |  |  |  |  |  |  |  |  |  |  |  |  |  |  | 0.34 |  |  | 2.49 |
| V$_{(7,3)}$ |  |  |  |  |  |  |  |  |  |  |  |  |  |  |  | 0.34 |  |  |
| V$_{(7,4)}$ |  |  |  |  |  |  |  |  |  |  |  |  |  |  |  | 2.49 | 0.34 |  |
| V$_{(7,5)}$ |  |  |  |  |  |  |  |  |  |  |  |  |  |  |  | 0.34 | 2.49 | 0.34 |
| V$_{(7,6)}$ |  |  |  |  |  |  |  |  |  |  |  |  |  |  |  |  | 0.34 | 2.49 |
| V$_{(7,7)}$ |  |  |  |  |  |  |  |  |  |  |  |  |  |  |  |  |  | 0.34 |

In another embodiment of steps S55-S56, the present disclosure adopts zero-one integer programming to solve AX≤B, and thereby obtaining the correcting pixel matrix X. Each of the plurality of correcting results corresponds to a correcting pixel in the matrix X.

Step S56 shows that "comparing each of the plurality of correcting results with one of the exposure states of the circuit bitmap to generate a comparing result". Said one of the exposure states of the circuit bitmap may correspond to one of error pixels, correcting pixels and verifying pixels. In step S56, the processor determines whether the correcting result of a pixel (i.e., the exposure state of every error pixel, every correcting pixel and every verifying pixel) conforms to the exposure state of this pixel in the circuit bitmap. In an embodiment, if the correcting result of every pixel conforms to its corresponding exposure state, it means that the current position point arrangement used for correction eliminates the error pixels and ensures that the verifying pixels have correct exposure states. Therefore, the comparison result in step S56 is "positive" and step S57 will be performed next. Step S57 shows that "updating said one of said at least one position distribution graph according to the comparing result and the point arrangement", wherein the updated position distribution graph comprises a plurality of correcting position points. The correcting position points may be different from position points mentioned in step S12. For example, the position that originally belonged to the position point in step S12 may no longer be a position point in the updated position distribution graph. For another example, the position that did not belong to the position point in step S12 may become the position point in the updated position distribution graph. For further another example, the position that originally belonged to the position point in step S12 may still be a position point in the updated position distribution graph. In another embodiment, it is possible that the correcting result satisfying all pixels cannot be found. Therefore, when the number of unsatisfied pixels is smaller than a threshold, a comparison result indicating that the point arrangement is qualified can be generated in step S56. In further another embodiment, a plurality of qualified point arrangements may be found if the point arrangements of all combinations are inputted. In this condition, the present disclosure adopts the qualified point arrangement obtained for the first time will be used to update the position distribution graph, and thereby speeding up the overall process. If the comparison result in step S56 shows negative, the method returns step S53 to generate another point arrangement, and performs the process of steps S54-S56 again to find a qualified point arrangement.

Figure 15:
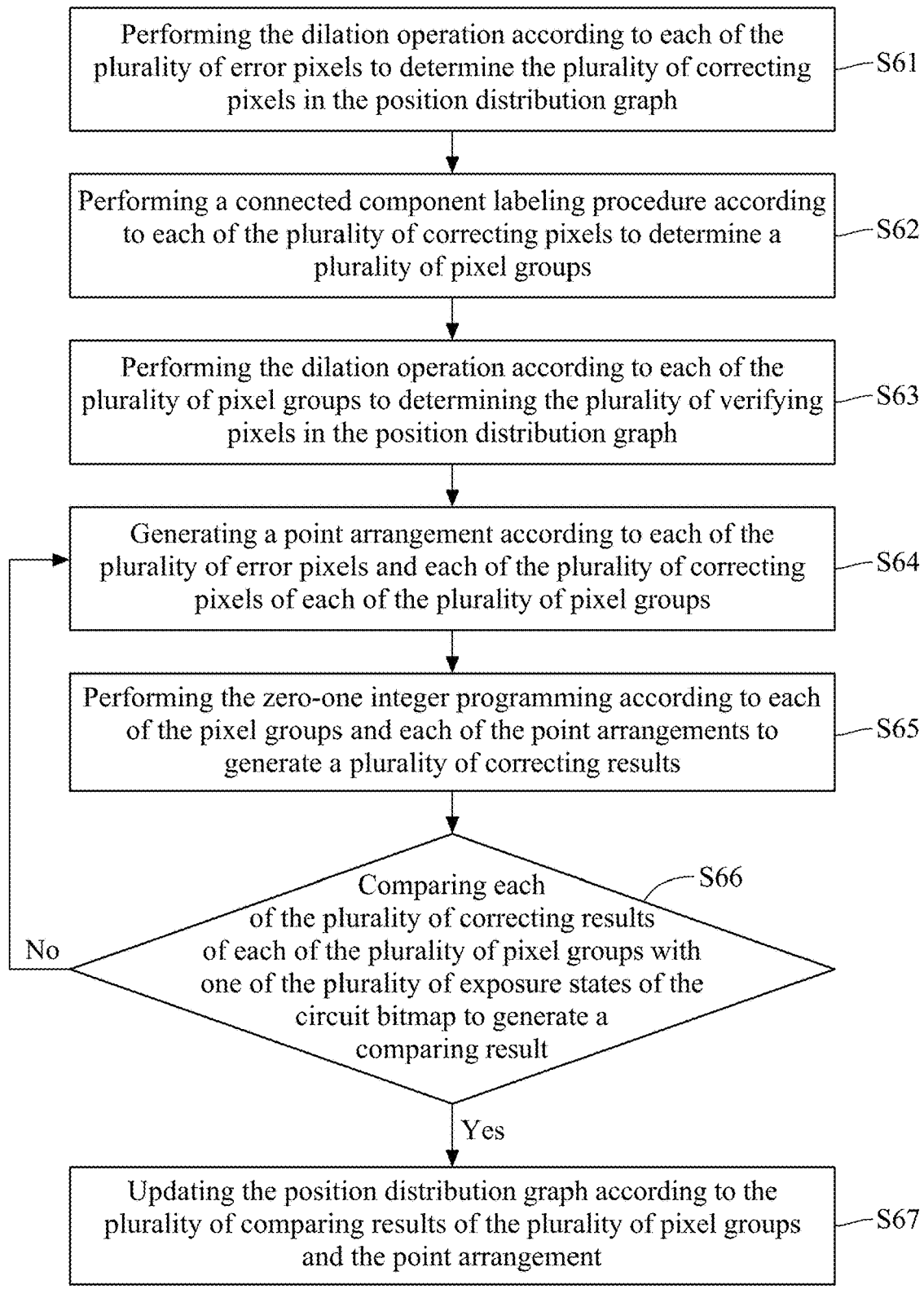
FIG. 15 is a flowchart of the second embodiment of step S5 in FIG. 1.

FIG. 15 is a flowchart of the second embodiment of step S5 in FIG. 1. In an embodiment, the process of FIG. 15 can be performed for multiple times according to the number of pixel groups. In another embodiment, multiple processors can simultaneously perform the process of FIG. 15 for multiple pixel groups. The present disclosure does not limit thereof.

Step S61 shows that "performing the dilation operation according to each of the plurality of error pixels to determine the plurality of correcting pixels in the position distribution graph". Step S61 is similar to step S52. In an embodiment, the dilation operation is performed on at least one error pixel in step S52, and is performed on all error pixels in step S61.

Step S62 shows that "performing a connected component labeling procedure according to each of the plurality of correcting pixels to determine a plurality of pixel groups". In an embodiment, before the group determination performed in step S62 the dilation operation in step S61 is completed so as to confirm the range of each pixel group. The distance between each correcting pixel of each pixel group and one of the error pixels is smaller than or equal to the radius of the virtual spot. The pixel group comprises a plurality of correcting pixels of all correcting pixels, and the correcting pixels of a pixel group have a connection property. For example, said connection property means that two pixels share one margin, i.e., two pixels are adjacent to each other. The connected component labeling (CCL) procedure is configured to label a specific mark to every connected region in the bitmap, wherein the connected region consists of adjacent correcting pixels or adjacent error pixels.

FIG. 16 is an example of the pixel group, wherein the grids marking XA and XB represent error pixels, the grids marking $FA_1$-$FA_8$ represent correcting pixels of the error pixel XA, and the grids marking $FB_1$-$FB_8$ represent correcting pixels of the error pixel XB. The three correcting pixels $FA_1$, $FA_4$ and $FA_7$ at the right side of the error pixel XA are adjacent to the three correcting pixels $FB_1$, $FB_4$ and $FB_7$ at the left side of the error pixel XA, and these correcting pixels have connection property. A plurality of independent pixel groups can be determined by perform CCL procedure on all correcting pixels, and any two of the plurality of pixel groups does not have the connection property.

Step S63 shows that "performing the dilation operation according to each of the plurality of pixel groups to determining the plurality of verifying pixels in the position distribution graph", wherein a distance between each of the plurality of correcting pixels in the pixel group and one of the error pixels is smaller than or equal to the radius of the virtual spot. Step S63 is similar to step S54. In an embodiment, step S54 perform the dilation operation on each of all correcting pixels and step S63 performs the dilation operation on all correcting pixels of each pixel group. FIG. 17 is a schematic diagram of verifying pixels determined according correcting pixels in FIG. 16, and the grids marking V is the verifying pixels except error pixels and correcting pixels.

Step S64 shows that "generating a point arrangement according to each of the plurality of error pixels and each of the plurality of correcting pixels of each of the plurality of pixel groups". Step S64 is similar to step S53. In an embodiment, a point arrangement for all correcting pixels is generated in step S53, a point arrangement is generated for error pixels and correcting pixels of each pixel group is step S64, therefore, the plurality of point arrangements corresponding to the plurality of pixel groups are generated in step S64. A point arrangement generated in step S64 is associated with all correcting pixels (including error pixels) in a pixel group. Based on the example of FIG. 16, a matrix of 18 rows and 1 column is generated in step S64 for representing 18 correcting pixels $FA_1$-$FA_8$, XA, $FB_1$-$FB_8$, and XB shown in FIG. 16. For example, said matrix is $[X_1 X_2 X_3 \ldots X_{18}]^T_{18 \times 1}$, wherein $X_1$-$X_8$ correspond to $FA_1$-$FA_8$ respectively, $X_9$ corresponds to XA, $X_{10}$-$X_{17}$ correspond to $FB_1$-$FB_8$ respectively and $X_{18}$ corresponds to XB.

Step S65 shows that "performing the zero-one integer programming according to each of the pixel groups and each of the point arrangements to generate a plurality of correcting results". Step S65 is similar to step S55. In an embodiment, the zero-one integer programming is performed on a point arrangement corresponding to each error pixel in step S55, and the zero-one integer programming is performed on a point arrangement corresponding to each pixel group in step S65.

Step S66 shows that "comparing each of the plurality of correcting results of each of the plurality of pixel groups with one of the plurality of exposure states of the circuit bitmap to generate a comparing result", and step S67 shows that "updating the position distribution graph according to the plurality of comparing results of the plurality of pixel groups and the point arrangement". The process of steps S66-S67 is similar to the process of steps S56-S57. The process returning from step S66 to S64 is similar to the process return form step S56 to S53. In an embodiment, steps S56-S7 are performed on pixels and steps S66-S67 are performed on pixels of pixel groups.

In a second embodiment of step S5 in FIG. 1, the CCL procedure is performed in step S62 so as to separate correcting pixels into multiple pixel groups. Because the radius of the laser spot has a certain size, the dose cumulative values of the correcting pixels around the error pixel affect each other. Correcting pixels with connected properties in a pixel group are interactively coupled to each other and have coherence, and it is not easy to extract them separately for performing the zero-one integer programming. A plurality of independent pixel groups can be determined by using the CCL procedure, these pixel groups are suitable for parallelized execution of zero-one integer programming, and thereby improving the efficiency of error pixel correction.

Figure 18:
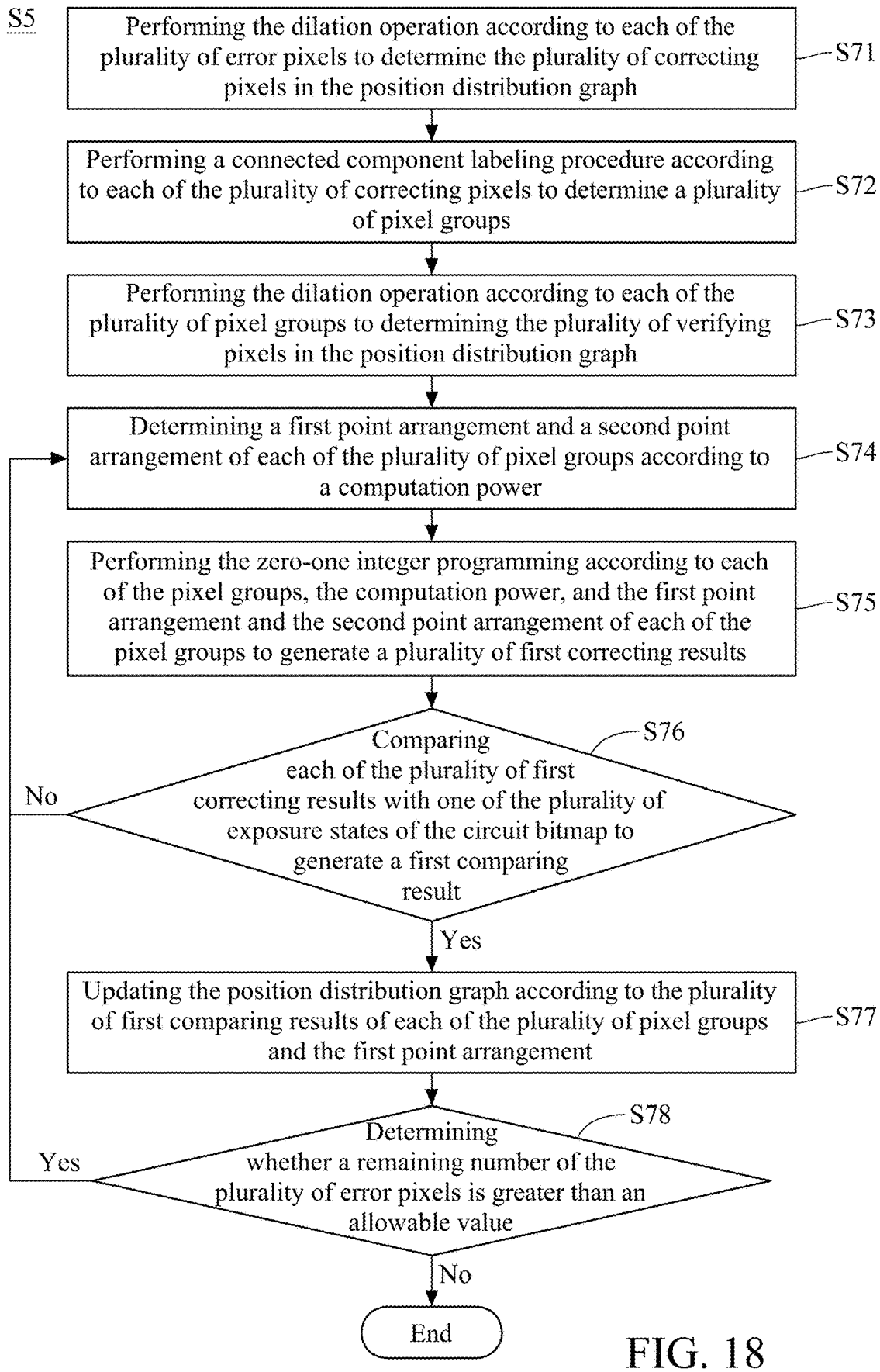
FIG. 18 is a flowchart of the third embodiment of step S5 in FIG. 1.

The dimension of matrix operations is limited by hardware capabilities. In other words, when the processor performs a zero-one integer programming based on the point arrangement, the "computation power" of the processor determines the number of correcting pixels that can be calculated in a single operation with the point arrangement. In one embodiment, the computation power is the number of pixels that the processor can process at a time. In another embodiment, the computation power is determined by the user, and its value does not exceed the calculation capability of the processor. In the second embodiment of step S5 in FIG. 1, the processor processes all the error pixels and the correcting pixels in a pixel group at a time. The third embodiment of step S5 can be adopted if the processor cannot process all of the correcting pixels of a pixel group at a time or the user wants to speed up the overall processing flow. FIG. 18 is a flowchart of a third embodiment of step S5 in FIG. 1, wherein the process from steps S71 to S73 is similar to the process from steps S61 to S63. It should be noticed that the "correcting pixels" mentioned below refers to the pixels located around the error pixels determined by the dilation operation and the error pixels themselves.

Step S74 shows that "determining a first point arrangement and a second point arrangement of each of the plurality of pixel groups according to a computation power". Step S74 is similar to step S64 of the second embodiment. In step S7 of the third embodiment, the point arrangement can be separated into a dynamic part and a static part. The number of correcting pixels in the dynamic part is determined by the first point arrangement, and the number of correcting pixels in the static part is determined by the second point arrangement. The first point arrangement comprises a plurality of first values, which will be adjusted in the zero-one programming of step S75. The second point arrangement comprises a plurality of second values, which will be set to fixed default values in the zero-one programming of step S75. The total number of the first values and the second values is associated with the computation power. In an embodiment, the total number of the first values and the second values is equal to or smaller than the computation power.

Figures 19, 20:
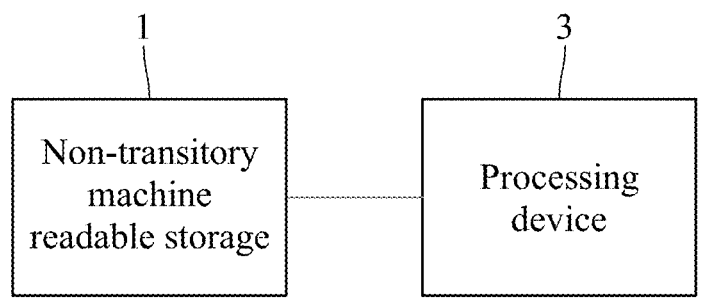
FIG. 19 is schematic diagram showing a part of the large pixel group.
FIG. 20 is a block diagram of the system for generating and updating position distribution graph according to an embodiment of the present disclosure.

Please refer to FIG. 19, which shows schematic diagram showing a part of the large pixel group. In an embodiment, if the computation power of the processor is 20 pixels, the processor cannot correct all correcting pixels F, X shown in FIG. 19 in one operation. Therefore, for a large pixel group whose number of correction pixels exceeds the computation power, when step S74 of the third embodiment is performed, all the correcting pixels F, X in the large pixel group are sorted according to the coordinate of the correcting pixels F, X corresponding to the two-dimensional matrix, and then the row scan or column scan strategy is adopted to select the first 20 correcting pixels. For example, according to the column scan strategy, the 20 correcting pixels whose coordinates are (1, 8), (1, 9), (1, 10), (2, 10), (2, 9), (2, 8), (2, 7), (3, 6), (3, 7), (3, 8), (3, 9), (3, 10), . . . , (5, 5) and (5, 6) are selected as the first batch of correcting pixels that will be computed by the processor, and the 20 correcting pixels whose coordinates are (5, 7), (5, 8), (6, 7), (6, 6), (6, 5), (6, 4), . . . , (9, 1), (9, 2) are selected as the second batch of correcting pixels. Based on the above method, the next batch of 20 correcting pixels F, X are continuously selected until all correcting pixels F, X in this large pixel group are selected.

In two batches of correcting pixels which are selected consecutively, it is possible that the first batch and the second batch have at least two correcting pixels which are connected to each other, so that the pixels corrected later will affect the pixels corrected earlier. Taking FIG. 19 as the example, the correcting pixel (6, 4) of the second batch and the correcting pixel (5, 4) of the first batch are connected to each other. However, these two correcting pixels (6, 4), (5, 4) are not processed at the same time, i.e., the processing timing of the correcting pixel (5, 4) in the first batch is earlier than the processing timing of the correcting pixel (6, 4) in the second batch. Therefore, the 20 correcting pixels F, X will be divided into the dynamic part and the static part in step S74 of the third embodiment, and this method can avoid replacing the earlier correction with the later correction and thus wasting the computing power of the processor. The dynamic part is determined by the first point arrangement, and the static part is determined by the second point arrangement. The dynamic part is similar to point arrangement of step S64. The plurality of first values of the dynamic part will be adjusted by the zero-one integer programming performed in step S75. The second values of the static part are fixed numbers that are not changed during the zero-one integer programming of step S75. Regarding the setting strategy of these fixed numbers, for example, all of the second values are set to 0, 1, or defined by a default 0-1 combinational sequence. The present disclosure does not limit the setting strategies of these fixed numbers nor the number of first values and the number of second values. Taking FIG. 19 as an example, under the premise that the total number does not exceed 20 correcting pixels, the first values and the second values correspond to 10 correcting pixels respectively, or the first values correspond to 15 correcting pixels and the second values correspond to 5 correcting pixels.

In one embodiment, the static part comprises the correcting pixels adjacent to the other correcting pixels of the previous batch, and the dynamic part comprises the correcting pixels not adjacent to the other correcting pixels of the previous batch. Taking FIG. 19 as an example, the correcting pixel (6, 4) in the second batch and the correcting pixel (5, 4) in the first batch are connected to each other in the horizontal direction, and the correcting pixels (7, 2) in the second batch and the correcting pixels (5, 4) in the first batch are not connected to each other, so the correcting pixel (6, 4) belongs to the static part, and the correcting pixel (7, 2) belongs to the dynamic part.

Step S75 shows that "performing the zero-one integer programming according to each of the pixel groups, the computation power, and the first point arrangement and the second point arrangement of each of the pixel groups to generate a plurality of first correcting results", wherein each of the plurality of first correcting results indicates whether each of said at least one of the plurality of error pixels, the plurality of correcting pixels, and the plurality of verifying pixels is at the first exposure level or at the second exposure level.

Step S75 is similar to step S65. In an embodiment, the plurality of correcting results generated in step S65 correspond to all error pixels, correcting pixels and verifying pixels in a pixel group, and the plurality of first correcting results generated in step S75 correspond some error pixels, correcting pixels and verifying pixels in a large pixel group.

Step S76 shows that "comparing each of the plurality of first correcting results with one of the plurality of exposure states of the circuit bitmap to generate a first comparing result". Step S76 is similar to step S66.

Step S77 shows that "updating the position distribution graph according to the plurality of first comparing results of each of the plurality of pixel groups and the first point arrangement". Step S77 is similar to step S67. In an embodiment, correcting pixels F, X corresponding to all values of the point arrangement are updated to the position distribution graph in step S67, and correcting pixels F, X corresponding to all first values of the first point arrangement are updated to the position distribution graph in step S77.

Step S78 shows that "determining whether a remaining number of the plurality of error pixels is greater than an allowable value". A part of error pixels has been eliminated due to the correction after the process of steps S76-S77 is performed once. Therefore, it has to determine whether the remaining number of the error pixels in a large pixel group is still greater than the allowable value every time after correction. The positive determination result means that the remaining pixels still need to be corrected, and step S74 will be performed again. The negative determination result means that the number of remaining error pixels is smaller than or equal to the allowable value, so the correction task can be stopped. In practice, it is possible that a correcting pixel F, X fails in one of two consecutive correcting results. In other words, the value of a correcting pixels obtained in the $k^{th}$ correction is different from the value of the correcting pixel obtained in the $(k+1)^{th}$ correction. For example, for the correcting pixels in adjacent regions A and B, setting this correcting pixel to 1 solves the correction of region A but the correction of region B is no satisfied. Conversely, setting this correcting pixel to 0 solves the correction of region B but the correction of region A is not satisfied. The design of allowable value can ignore the repeated correction of the correcting pixels that excessively occupy the computing resources of the processor.

In order to clearly explain the third embodiment, the process after returning to step S74 will be explained again. For the convenience of description, when step S74 is performed for the second time, the generated first point arrangement will be called the third point arrangement, and the generated second point arrangement will be called the fourth point arrangement. When step S75 is performed for the second time, the generated first correcting result is called the second correcting result. When step S76 is executed for the second time, the generated first comparison result is called the second comparison result.

The third point arrangement and the fourth point arrangement are determined according to the computation power when step S74 is performed for the second time. The third point arrangement comprises a plurality of third values, the fourth point arrangement comprises a plurality of fourth values, and the total number of the third valued and the fourth values is associated with the computation power. In order to avoid correcting pixels from being repeatedly corrected, one of correcting pixels in a pixel group can be set to the second value at a first timing and be set to the third value at the second timing, wherein the first timing is earlier than the second timing. In short, there are the same one or more correcting pixels in the plurality of correcting pixels selected twice consecutively. For example, when step S74 is performed for the first time, the $1^{st}$ to $100^{th}$ correcting pixels are selected, and when step S74 is performed for the second time, the $51^{st}$ to $150^{th}$ correcting pixels are selected. The aforementioned numbers are only examples, and are not used to limit the number of correcting pixels that are repeatedly selected.

A plurality of second correcting results is generated according to the pixel group, the computation power, the third point arrangement and the fourth point arrangement when step S75 is performed for the second time. The zero-one programming performed in step S75 will dynamically change the third values but the fourth values are unchanged. A plurality of second comparison results is generated by comparing every second correcting result and one of exposure states in the circuit bitmap when step S76 is performed for the second time. The position distribution graph is updated according to the second comparison results and the third point arrangement when step S77 is performed for the second time.

FIG. 20 is a block diagram of the system for generating and updating position distribution graph according to an embodiment of the present disclosure. The system for generating and updating position distribution graph comprises a non-transitory machine readable medium 1 and a processing device 3. The non-transitory machine readable medium 1 is configured to store a plurality of instructions. The processing device 3 electrically connect to the non-transitory machine readable medium 1. The processing device performs the plurality of instructions and triggers a plurality of operations. The plurality of operations comprises: generating at least one position distribution graph according to a circuit bitmap and an exposure pattern; wherein the circuit bitmap comprises a plurality of target pixels and a plurality of background pixels, each of said at least one position distribution graph comprises a plurality of position points, the plurality of position points locates at a part of the plurality of target pixels and are associated with the exposure pattern; performing an exposure simulation according to each of said at least one position distribution graph to generate at least one exposure result graph, wherein the exposure simulation comprises forming a virtual spot according to each of the plurality of position points of each of said at least one position distribution graph; comparing the circuit bitmap with said at least one exposure result graph to generate at least one error distribution candidate graph; selecting one of the error distribution candidate graph to serve as an error distribution graph, wherein the error distribution graph comprises a plurality of error pixels; and performing a zero-one integer programming according to the circuit bitmap and at least one of the plurality of error pixels to update one of said at least one position distribution graph, wherein the updated position distribution graph comprises a plurality of correcting position points and is associated with the selected error distribution graph.

In an embodiment of the system for generating and updating position distribution graph, the plurality of target pixels forms a circuit structure, each of the plurality of target pixels and the plurality of background pixels has an exposure state, the exposure state of each of the plurality of target pixels is at a first exposure level, and the exposure state of each of the plurality of background pixels is at a second exposure level lower than the first exposure level.

In an embodiment of the system for generating and updating position distribution graph, said at least one error distribution candidate graph comprises a plurality of error distribution candidate graphs, the plurality of error distribution candidate graphs has a plurality of error numbers respectively, each of the plurality of error numbers indicates a number of the plurality of error pixels in each of the plurality of error distribution candidate graphs. In the plurality of operations, selecting one of the error distribution candidate graph to serve as the error distribution graph comprises: determining a smallest one of the plurality of error numbers; and selecting one of said at least one error distribution candidate graph to serve as the error distribution graph, with the selected error distribution candidate graph having the smallest error number.

In an embodiment of the system for generating and updating position distribution graph, in the plurality of operations, performing the zero-one integer programming according to the circuit bitmap and said at least one of the plurality of error pixels to update said one of said at least one position distribution graph comprises: selecting at least one of the plurality of error pixels of the error distribution graph to perform a dilation operation to determine a plurality of correcting pixels in said one of said at least one position distribution graph; determining a plurality of verifying pixels in said one of said at least one position distribution graph by performing the dilation operation according to each of the plurality of correcting pixels; and performing the zero-one integer programming according to the circuit bitmap and said at least one of the plurality of error pixels, the plurality of correcting pixels and the plurality of verifying pixels to update said one of said at least one position distribution graph.

In an embodiment of the system for generating and updating position distribution graph, in the plurality of operations, performing the zero-one integer programming according to the circuit bitmap and said at least one of the plurality of error pixels, the plurality of correcting pixels and the plurality of verifying pixels to update said one of said at least one position distribution graph comprises: generating a point arrangement according to said at least one of the plurality of error pixels and the plurality of correcting pixels; performing the zero-one integer programming according to said at least one of the plurality of error pixels, the plurality of correcting pixels, and the point arrangement to generate a plurality of correcting results; comparing each of the plurality of correcting results with one of the exposure states of the circuit bitmap to generate a comparing result, wherein each of the plurality of correcting results indicates whether each of said at least one of the plurality of error pixels, the plurality of correcting pixels, and the plurality of verifying pixels is at the first exposure level or at the second exposure level; and updating said one of said at least one position distribution graph according to the comparing result and the point arrangement.

In an embodiment of the system for generating and updating position distribution graph, in the plurality of operations, selecting at least one of the plurality of error pixels of the error distribution graph to perform the dilation operation to determine the plurality of correcting pixels in said one of said at least one position distribution graph comprises: performing the dilation operation according to each of the plurality of error pixels of the error distribution graph to determine the plurality of correcting pixels; determining the plurality of verifying pixels in said one of said at least one position distribution graph by performing the dilation operation according to each of the plurality of correcting pixels comprises: performing a connected component labeling procedure according to each of the plurality of correcting pixels to determine a plurality of pixel groups; and performing the dilation operation according to each of the plurality of pixel groups to determining the plurality of verifying pixels in said one of said at least one position distribution graph; generating a point arrangement according to each of the plurality of error pixels and each of the plurality of correcting pixels of each of the plurality of pixel groups; performing the zero-one integer programming according to the circuit bitmap and said at least one of the plurality of error pixels, the plurality of correcting pixels and the plurality of verifying pixels to update said one of said at least one position distribution graph comprises: performing the zero-one integer programming according to each of the pixel groups and each of the point arrangements to generate a plurality of correcting results; comparing each of the plurality of correcting results of each of the plurality of pixel groups with one of the plurality of exposure states of the circuit bitmap to generate a comparing result, wherein each of the plurality of correcting results indicates whether each of said at least one of the plurality of error pixels, the plurality of correcting pixels, and the plurality of verifying pixels is at the first exposure level or at the second exposure level; and updating said one of said at least one position distribution graph according to the plurality of comparing results of the plurality of pixel groups and the point arrangement.

In an embodiment of the system for generating and updating position distribution graph, in the plurality of operations, selecting at least one of the plurality of error pixels of the error distribution graph to perform the dilation operation to determine the plurality of correcting pixels in said one of said at least one position distribution graph comprises: performing the dilation operation according to each of the plurality of error pixels of the error distribution graph to determine the plurality of correcting pixels; determining the plurality of verifying pixels in said one of said at least one position distribution graph by performing the dilation operation according to each of the plurality of correcting pixels comprises: performing a connected component labeling procedure according to each of the plurality of correcting pixels to determine a plurality of pixel groups; and performing the dilation operation according to each of the plurality of pixel groups to determining the plurality of verifying pixels in said one of said at least one position distribution graph; determining a first point arrangement and a second point arrangement of each of the plurality of pixel groups according to a computation power, wherein the first point arrangement comprises a plurality of first values, the zero-one integer programming dynamically changes the plurality of first values, the second point arrangement comprises a plurality of second values, and the plurality of second values are fixed when the zero-one integer programming is performed; performing the zero-one integer programming according to the circuit bitmap and said at least one of the plurality of error pixels, the plurality of correcting pixels and the plurality of verifying pixels to update said one of said at least one position distribution graph comprises: performing the zero-one integer programming according to each of the pixel groups, the computation power, and the first point arrangement and the second point arrangement of each of the pixel groups to generate a plurality of first correcting results; comparing each of the plurality of first correcting results of each of the plurality of pixel groups with one of the plurality of exposure states of the circuit bitmap to generate a first comparing result, wherein each of the plurality of first correcting results indicates whether each of said at least one of the plurality of error pixels, the plurality of correcting pixels, and the plurality of verifying pixels is at the first exposure level or at the second exposure level; and updating said one of said at least one position distribution graph according to the plurality of first comparing results of the plurality of pixel groups and the first point arrangement.

In an embodiment of the system for generating and updating position distribution graph, in the plurality of operations, after updating said one of said at least one position distribution graph according to the plurality of first comparing results of the plurality of pixel groups and the first point arrangement, further comprising: checking a remaining number of the plurality of error pixels of one of the plurality of pixel groups; determining a third point arrangement and a fourth point arrangement of said one of the plurality of pixel groups according to the computation power when the remaining number is greater than an allowable value; performing the zero-one integer programming according to said one of the plurality of pixel groups, the computation power, the third point arrangement and the fourth point arrangement to generate a plurality of second correcting results; comparing each of the plurality of second correcting results with one of the plurality of exposure states of the circuit bitmap to generate a second comparing result; and updating said one of said at least one position distribution graph according to the second comparing result and the third point arrangement; wherein the third point arrangement comprises a plurality of third values, the zero-one integer programming dynamically changes the plurality of third values, the fourth point arrangement comprises a plurality of fourth values, the plurality of fourth values are fixed when the zero-one integer programming is performed; and the plurality of third values and the plurality of fourth values are associated with the computation power.

In an embodiment of the system for generating and updating position distribution graph, one of the plurality of correcting pixels of said one of the plurality of pixel groups is set to the second value at a first timing, is set to the third value at a second timing, and the first timing is earlier than the second timing.

In an embodiment of the system for generating and updating position distribution graph, a length or a width of each of the plurality of target pixels and the plurality of background pixels is smaller than a diameter of the virtual spot.

In an embodiment of the system for generating and updating position distribution graph, a distance between two of the plurality of position points is larger than or equal to a length or a width of one of the plurality of target pixels.

In an embodiment of the system for generating and updating position distribution graph, each of said at least one exposure result graph comprises a plurality of exposure results, each of the plurality of exposure results corresponds to one of the plurality of target pixels and the plurality of background pixels, and each of the plurality of error pixels corresponds to one of the plurality of exposure results; wherein when one of the plurality of error pixels corresponds to said one of the plurality of background pixels, another one of the plurality of exposure results corresponding to said one of the plurality of error pixels is at a high exposure level; and when one of the plurality of error pixels corresponds to said one of the plurality of target pixels, one of the plurality of exposure results corresponding to said one of the plurality of error pixels is at a second exposure level lower than the first exposure level.

Accordingly, one embodiment of the disclosure proposes a method and system for generating and updating position distribution graph, thereby exposing with a large-size laser spot to obtain a small-size line width of a circuit.

In view of the above description, the method and system for generating and updating position distribution graph proposed in an embodiment of the disclosure determine a suitable exposure pattern through the exposure simulation in advance, and use connected-component labeling and parallelized integer programming to process, thereby reducing the calculation tasks to accelerate computation. The present disclosure exposes with a laser spot larger than the line width and meets the accuracy requirement of extremely small line width and line spacing.

What is claimed is:

1. A method for generating and updating position distribution graph comprises:
generating at least one position distribution graph according to a circuit bitmap and an exposure pattern; wherein the circuit bitmap comprises a plurality of target pixels and a plurality of background pixels, each of said at least one position distribution graph comprises a plurality of position points, the plurality of position points locates at a part of the plurality of target pixels and are associated with the exposure pattern;
performing an exposure simulation according to each of said at least one position distribution graph to generate at least one exposure result graph, wherein the exposure simulation comprises forming a virtual spot according to each of the plurality of position points of each of said at least one position distribution graph;
comparing the circuit bitmap with said at least one exposure result graph to generate a plurality of error distribution candidate graphs;
selecting one of the plurality of error distribution candidate graphs to serve as an error distribution graph, wherein the error distribution graph comprises a plurality of error pixels; and
performing a zero-one integer programming according to the circuit bitmap and at least one of the plurality of error pixels to update one of said at least one position distribution graph, wherein the updated position distribution graph comprises a plurality of correcting position points and is associated with the selected error distribution graph.

2. The method for generating and updating position distribution graph of claim 1, wherein the plurality of target pixels forms a circuit structure, each of the plurality of target pixels and the plurality of background pixels has an exposure state, the exposure state of each of the plurality of target pixels is at a first exposure level, and the exposure state of each of the plurality of background pixels is at a second exposure level lower than the first exposure level.

3. The method for generating and updating position distribution graph of claim 2, wherein performing the zero-one integer programming according to the circuit bitmap and said at least one of the plurality of error pixels to update said one of said at least one position distribution graph comprises:
selecting at least one of the plurality of error pixels of the error distribution graph to perform a dilation operation to determine a plurality of correcting pixels in said one of said at least one position distribution graph;
determining a plurality of verifying pixels in said one of said at least one position distribution graph by performing the dilation operation according to each of the plurality of correcting pixels; and
performing the zero-one integer programming according to the circuit bitmap and said at least one of the plurality of error pixels, the plurality of correcting pixels and the plurality of verifying pixels to update said one of said at least one position distribution graph.

4. The method for generating and updating position distribution graph of claim 3, wherein performing the zero-one integer programming according to the circuit bitmap and said at least one of the plurality of error pixels, the plurality of correcting pixels and the plurality of verifying pixels to update said one of said at least one position distribution graph comprises:
generating a point arrangement according to said at least one of the plurality of error pixels and the plurality of correcting pixels;
performing the zero-one integer programming according to said at least one of the plurality of error pixels, the plurality of correcting pixels, and the point arrangement to generate a plurality of correcting results;
comparing each of the plurality of correcting results with one of the exposure states of the circuit bitmap to generate a comparing result, wherein each of the plurality of correcting results indicates whether each of said at least one of the plurality of error pixels, the plurality of correcting pixels, and the plurality of verifying pixels is at the first exposure level or at the second exposure level; and
updating said one of said at least one position distribution graph according to the comparing result and the point arrangement.

5. The method for generating and updating position distribution graph of claim 3, wherein selecting at least one of the plurality of error pixels of the error distribution graph to perform the dilation operation to determine the plurality of correcting pixels in said one of said at least one position distribution graph comprises: performing the dilation operation according to each of the plurality of error pixels of the error distribution graph to determine the plurality of correcting pixels;
determining the plurality of verifying pixels in said one of said at least one position distribution graph by performing the dilation operation according to each of the plurality of correcting pixels comprises: performing a connected component labeling procedure according to each of the plurality of correcting pixels to determine a plurality of pixel groups; and performing the dilation operation according to each of the plurality of pixel groups to determining the plurality of verifying pixels in said one of said at least one position distribution graph;
generating a point arrangement according to each of the plurality of error pixels and each of the plurality of correcting pixels of each of the plurality of pixel groups;
performing the zero-one integer programming according to the circuit bitmap and said at least one of the plurality of error pixels, the plurality of correcting pixels and the plurality of verifying pixels to update said one of said at least one position distribution graph comprises: performing the zero-one integer programming according to each of the pixel groups and each of the point arrangements to generate a plurality of correcting results; comparing each of the plurality of correcting results of each of the plurality of pixel groups with one of the plurality of exposure states of the circuit bitmap to generate a comparing result, wherein each of the plurality of correcting results indicates whether each of said at least one of the plurality of error pixels, the plurality of correcting pixels, and the plurality of verifying pixels is at the first exposure level or at the second exposure level; and updating said one of said at least one position distribution graph according to the plurality of comparing results of the plurality of pixel groups and the point arrangement.

6. The method for generating and updating position distribution graph of claim 3, wherein selecting at least one of the plurality of error pixels of the error distribution graph to perform the dilation operation to determine the plurality of correcting pixels in said one of said at least one position distribution graph comprises: performing the dilation operation according to each of the plurality of error pixels of the error distribution graph to determine the plurality of correcting pixels;

determining the plurality of verifying pixels in said one of said at least one position distribution graph by performing the dilation operation according to each of the plurality of correcting pixels comprises: performing a connected component labeling procedure according to each of the plurality of correcting pixels to determine a plurality of pixel groups; and performing the dilation operation according to each of the plurality of pixel groups to determining the plurality of verifying pixels in said one of said at least one position distribution graph;

determining a first point arrangement and a second point arrangement of each of the plurality of pixel groups according to a computation power, wherein the first point arrangement comprises a plurality of first values, the zero-one integer programming dynamically changes the plurality of first values, the second point arrangement comprises a plurality of second values, and the plurality of second values are fixed when the zero-one integer programming is performed;

performing the zero-one integer programming according to the circuit bitmap and said at least one of the plurality of error pixels, the plurality of correcting pixels and the plurality of verifying pixels to update said one of said at least one position distribution graph comprises: performing the zero-one integer programming according to each of the pixel groups, the computation power, and the first point arrangement and the second point arrangement of each of the pixel groups to generate a plurality of first correcting results; comparing each of the plurality of first correcting results of each of the plurality of pixel groups with one of the plurality of exposure states of the circuit bitmap to generate a first comparing result, wherein each of the plurality of first correcting results indicates whether each of said at least one of the plurality of error pixels, the plurality of correcting pixels, and the plurality of verifying pixels is at the first exposure level or at the second exposure level;

and updating said one of said at least one position distribution graph according to the plurality of first comparing results of the plurality of pixel groups and the first point arrangement.

7. The method for generating and updating position distribution graph of claim 6, after updating said one of said at least one position distribution graph according to the plurality of first comparing results of the plurality of pixel groups and the first point arrangement, further comprising:

checking a remaining number of the plurality of error pixels of one of the plurality of pixel groups;

determining a third point arrangement and a fourth point arrangement of said one of the plurality of pixel groups according to the computation power when the remaining number is greater than an allowable value;

performing the zero-one integer programming according to said one of the plurality of pixel groups, the computation power, the third point arrangement and the fourth point arrangement to generate a plurality of second correcting results;

comparing each of the plurality of second correcting results with one of the plurality of exposure states of the circuit bitmap to generate a second comparing result; and updating said one of said at least one position distribution graph according to the second comparing result and the third point arrangement;

wherein the third point arrangement comprises a plurality of third values, the zero-one integer programming dynamically changes the plurality of third values, the fourth point arrangement comprises a plurality of fourth values, the plurality of fourth values are fixed when the zero-one integer programming is performed; and the plurality of third values and the plurality of fourth values are associated with the computation power.

8. The method for generating and updating position distribution graph of claim 7, wherein one of the plurality of correcting pixels of said one of the plurality of pixel groups is set to the second value at a first timing, is set to the third value at a second timing, and the first timing is earlier than the second timing.

9. The method for generating and updating position distribution graph of claim 1, wherein the plurality of error distribution candidate graphs has a plurality of error numbers respectively, each of the plurality of error numbers indicates a number of the plurality of error pixels in each of the plurality of error distribution candidate graphs, and selecting one of the error distribution candidate graph to serve as the error distribution graph comprises:

determining a smallest one of the plurality of error numbers; and selecting one of the plurality of error distribution candidate graphs to serve as the error distribution graph, with the selected error distribution candidate graph having the smallest error number.

10. The method for generating and updating position distribution graph of claim 1, wherein a length or a width of each of the plurality of target pixels and the plurality of background pixels is smaller than a diameter of the virtual spot.

11. The method for generating and updating position distribution graph of claim 1, wherein a distance between two of the plurality of position points is larger than or equal to a length or a width of one of the plurality of target pixels.

12. The method for generating and updating position distribution graph of claim 1, wherein each of said at least one exposure result graph comprises a plurality of exposure results, each of the plurality of exposure results corresponds to one of the plurality of target pixels and the plurality of background pixels, and each of the plurality of error pixels corresponds to one of the plurality of exposure results; wherein when one of the plurality of error pixels corresponds to said one of the plurality of background pixels, one of the plurality of exposure results corresponding to said one of the plurality of error pixels is at a first exposure level; and when another one of the plurality of error pixels corresponds to said one of the plurality of target pixels, said another one of the plurality of exposure results corresponding to said one of the plurality of error pixels is at a second exposure level lower than the first exposure level.

13. A system for generating and updating position distribution graph comprises: a non-transitory machine readable medium storing a plurality of instructions, and a processing device electrically connecting to the non-transitory machine readable medium, wherein the processing device performs the plurality of instructions and triggers a plurality of operations, and the plurality of operations comprises:

generating at least one position distribution graph according to a circuit bitmap and an exposure pattern; wherein the circuit bitmap comprises a plurality of target pixels and a plurality of background pixels, each of said at least one position distribution graph comprises a plurality of position points, the plurality of position points locates at a part of the plurality of target pixels and are associated with the exposure pattern;

performing an exposure simulation according to each of said at least one position distribution graph to generate at least one exposure result graph, wherein the exposure simulation comprises forming a virtual spot according to each of the plurality of position points of each of said at least one position distribution graph;

comparing the circuit bitmap with said at least one exposure result graph to generate a plurality of error distribution candidate graphs;

selecting one of the plurality of error distribution candidate graphs to serve as an error distribution graph, wherein the error distribution graph comprises a plurality of error pixels; and performing a zero-one integer programming according to the circuit bitmap and at least one of the plurality of error pixels to update one of said at least one position distribution graph, wherein the updated position distribution graph comprises a plurality of correcting position points and is associated with the selected error distribution graph.

14. The system for generating and updating position distribution graph of claim 13, wherein the plurality of target pixels forms a circuit structure, each of the plurality of target pixels and the plurality of background pixels has an exposure state, the exposure state of each of the plurality of target pixels is at a first exposure level, and the exposure state of each of the plurality of background pixels is at a second exposure level lower than the first exposure level.

15. The system for generating and updating position distribution graph of claim 14, in the plurality of operations, performing the zero-one integer programming according to the circuit bitmap and said at least one of the plurality of error pixels to update said one of said at least one position distribution graph comprises:

selecting at least one of the plurality of error pixels of the error distribution graph to perform a dilation operation to determine a plurality of correcting pixels in said one of said at least one position distribution graph;

determining a plurality of verifying pixels in said one of said at least one position distribution graph by performing the dilation operation according to each of the plurality of correcting pixels; and performing the zero-one integer programming according to the circuit bitmap and said at least one of the plurality of error pixels, the plurality of correcting pixels and the plurality of verifying pixels to update said one of said at least one position distribution graph.

16. The system for generating and updating position distribution graph of claim 15, in the plurality of operations, performing the zero-one integer programming according to the circuit bitmap and said at least one of the plurality of error pixels, the plurality of correcting pixels and the plurality of verifying pixels to update said one of said at least one position distribution graph comprises:

generating a point arrangement according to said at least one of the plurality of error pixels and the plurality of correcting pixels;

performing the zero-one integer programming according to said at least one of the plurality of error pixels, the plurality of correcting pixels, and the point arrangement to generate a plurality of correcting results;

comparing each of the plurality of correcting results with one of the exposure states of the circuit bitmap to generate a comparing result, wherein each of the plurality of correcting results indicates whether each of said at least one of the plurality of error pixels, the plurality of correcting pixels, and the plurality of verifying pixels is at the first exposure level or at the second exposure level; and updating said one of said at least one position distribution graph according to the comparing result and the point arrangement.

17. The system for generating and updating position distribution graph of claim 15, in the plurality of operations, selecting at least one of the plurality of error pixels of the error distribution graph to perform the dilation operation to determine the plurality of correcting pixels in said one of said at least one position distribution graph comprises:

performing the dilation operation according to each of the plurality of error pixels of the error distribution graph to determine the plurality of correcting pixels;

determining the plurality of verifying pixels in said one of said at least one position distribution graph by performing the dilation operation according to each of the plurality of correcting pixels comprises: performing a connected component labeling procedure according to each of the plurality of correcting pixels to determine a plurality of pixel groups; and performing the dilation operation according to each of the plurality of pixel groups to determining the plurality of verifying pixels in said one of said at least one position distribution graph;

generating a point arrangement according to each of the plurality of error pixels and each of the plurality of correcting pixels of each of the plurality of pixel groups;

performing the zero-one integer programming according to the circuit bitmap and said at least one of the plurality of error pixels, the plurality of correcting pixels and the plurality of verifying pixels to update said one of said at least one position distribution graph comprises: performing the zero-one integer programming according to each of the pixel groups and each of the point arrangements to generate a plurality of correcting results; comparing each of the plurality of correcting results of each of the plurality of pixel groups with one of the plurality of exposure states of the circuit bitmap to generate a comparing result, wherein each of the plurality of correcting results indicates whether each of said at least one of the plurality of error pixels, the plurality of correcting pixels, and the plurality of verifying pixels is at the first exposure level or at the second exposure level; and updating said one of said at least one position distribution graph according to the plurality of comparing results of the plurality of pixel groups and the point arrangement.

18. The system for generating and updating position distribution graph of claim 15, in the plurality of operations, selecting at least one of the plurality of error pixels of the error distribution graph to perform the dilation operation to determine the plurality of correcting pixels in said one of said at least one position distribution graph comprises: performing the dilation operation according to each of the plurality of error pixels of the error distribution graph to determine the plurality of correcting pixels;
 determining the plurality of verifying pixels in said one of said at least one position distribution graph by performing the dilation operation according to each of the plurality of correcting pixels comprises: performing a connected component labeling procedure according to each of the plurality of correcting pixels to determine a plurality of pixel groups; and performing the dilation operation according to each of the plurality of pixel groups to determining the plurality of verifying pixels in said one of said at least one position distribution graph;
 determining a first point arrangement and a second point arrangement of each of the plurality of pixel groups according to a computation power, wherein the first point arrangement comprises a plurality of first values, the zero-one integer programming dynamically changes the plurality of first values, the second point arrangement comprises a plurality of second values, and the plurality of second values are fixed when the zero-one integer programming is performed;
 performing the zero-one integer programming according to the circuit bitmap and said at least one of the plurality of error pixels, the plurality of correcting pixels and the plurality of verifying pixels to update said one of said at least one position distribution graph comprises: performing the zero-one integer programming according to each of the pixel groups, the computation power, and the first point arrangement and the second point arrangement of each of the pixel groups to generate a plurality of first correcting results; comparing each of the plurality of first correcting results of each of the plurality of pixel groups with one of the plurality of exposure states of the circuit bitmap to generate a first comparing result, wherein each of the plurality of first correcting results indicates whether each of said at least one of the plurality of error pixels, the plurality of correcting pixels, and the plurality of verifying pixels is at the first exposure level or at the second exposure level; and updating said one of said at least one position distribution graph according to the plurality of first comparing results of the plurality of pixel groups and the first point arrangement.

19. The system for generating and updating position distribution graph of claim 18, in the plurality of operations, after updating said one of said at least one position distribution graph according to the plurality of first comparing results of the plurality of pixel groups and the first point arrangement, further comprising:
 checking a remaining number of the plurality of error pixels of one of the plurality of pixel groups;
 determining a third point arrangement and a fourth point arrangement of said one of the plurality of pixel groups according to the computation power when the remaining number is greater than an allowable value;
 performing the zero-one integer programming according to said one of the plurality of pixel groups, the computation power, the third point arrangement and the fourth point arrangement to generate a plurality of second correcting results;
 comparing each of the plurality of second correcting results with one of the plurality of exposure states of the circuit bitmap to generate a second comparing result; and
 updating said one of said at least one position distribution graph according to the second comparing result and the third point arrangement;
 wherein the third point arrangement comprises a plurality of third values, the zero-one integer programming dynamically changes the plurality of third values, the fourth point arrangement comprises a plurality of fourth values, the plurality of fourth values are fixed when the zero-one integer programming is performed; and the plurality of third values and the plurality of fourth values are associated with the computation power.

20. The system for generating and updating position distribution graph of claim 19, wherein one of the plurality of correcting pixels of said one of the plurality of pixel groups is set to the second value at a first timing, is set to the third value at a second timing, and the first timing is earlier than the second timing.

21. The system for generating and updating position distribution graph of claim 13, wherein a length or a width of each of the plurality of target pixels and the plurality of background pixels is smaller than a diameter of the virtual spot.

22. The system for generating and updating position distribution graph of claim 13, wherein the plurality of error distribution candidate graphs has a plurality of error numbers respectively, each of the plurality of error numbers indicates a number of the plurality of error pixels in each of the plurality of error distribution candidate graphs, and in the plurality of operations, selecting one of the error distribution candidate graph to serve as the error distribution graph comprises:
 determining a smallest one of the plurality of error numbers; and
 selecting one of the plurality of error distribution candidate graphs to serve as the error distribution graph, with the selected error distribution candidate graph having the smallest error number.

23. The system for generating and updating position distribution graph of claim 13, wherein a distance between two of the plurality of position points is larger than or equal to a length or a width of one of the plurality of target pixels.

24. The system for generating and updating position distribution graph of claim 13, wherein each of said at least one exposure result graph comprises a plurality of exposure results, each of the plurality of exposure results corresponds to one of the plurality of target pixels and the plurality of background pixels, and each of the plurality of error pixels corresponds to one of the plurality of exposure results; wherein
 when one of the plurality of error pixels corresponds to said one of the plurality of background pixels, one of the plurality of exposure results corresponding to said one of the plurality of error pixels is at a first exposure level; and when another one of the plurality of error pixels corresponds to said one of the plurality of target pixels, said another one of the plurality of exposure results corresponding to said one of the plurality of error pixels is at a second exposure level lower than the first exposure level.

\* \* \* \* \*